US010439359B2

(12) United States Patent
Miyata et al.

(10) Patent No.: US 10,439,359 B2
(45) Date of Patent: Oct. 8, 2019

(54) LIGHT SOURCE DEVICE

(71) Applicant: NICHIA CORPORATION, Anan-shi, Tokushima (JP)

(72) Inventors: Tadaaki Miyata, Yokohama (JP); Yoshihiro Kimura, Yokohama (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/007,964

(22) Filed: Jun. 13, 2018

(65) Prior Publication Data
US 2018/0366903 A1 Dec. 20, 2018

(30) Foreign Application Priority Data

Jun. 14, 2017 (JP) .................................. 2017-116926

(51) Int. Cl.
H01S 5/02 (2006.01)
H01S 5/022 (2006.01)

(52) U.S. Cl.
CPC ........ *H01S 5/02292* (2013.01); *H01S 5/0216* (2013.01); *H01S 5/02296* (2013.01); *H01S 5/02216* (2013.01)

(58) Field of Classification Search
CPC ............... H01S 5/02292; H01S 5/0216; H01S 5/02296; H01S 5/02216
See application file for complete search history.

(56) References Cited

U.S. PATENT DOCUMENTS 6,759,687 B1 7/2004 Miller et al.
2006/0054910 A1 3/2006 Takemori et al.
(Continued)

FOREIGN PATENT DOCUMENTS

CN 102282686 A 12/2011
JP 2006086176 A 3/2006
(Continued)

Primary Examiner — Yuanda Zhang
(74) Attorney, Agent, or Firm — Hunton Andrews Kurth LLP

(57) ABSTRACT

A light source device includes: a base member; a semiconductor laser mounted on an upper surface of the base member; a lateral wall portion having: a lower surface facing the upper surface of the base member and being a non-reflecting surface, and a reflecting surface that reflects light emitted from the semiconductor laser, is connected to the lower surface of the lateral wall portion at a lower end portion of the reflecting surface, and is inclined with respect to the upper surface of the base member; a first bonding film that is a metal film disposed in a region on the upper surface of the base member facing the lower surface of the lateral wall portion; a second bonding film that is a metal film disposed on the lower surface of the lateral wall portion; and a metal bonding member fuse-bonded to the first bonding film and the second bonding film to each other. An end portion of the first bonding film at a reflecting-surface side and an end portion of the second bonding film at the reflecting-surface side are located separately from the lower end portion of the reflecting surface. A distance between the end portion of the first bonding film at the reflecting-surface side and the lower end portion of the reflecting surface is different from a distance between the end portion of the second bonding film at the reflecting-surface side and the lower end portion of the reflecting surface.

9 Claims, 12 Drawing Sheets

(56) References Cited

U.S. PATENT DOCUMENTS

| | | | |
|---|---|---|---|
| 2006/0198162 A1* | 9/2006 | Ishidu | H01L 33/60 |
| | | | 362/623 |
| 2006/0252167 A1 | 11/2006 | Wang | |
| 2011/0285017 A1 | 11/2011 | Ninz et al. | |
| 2017/0279019 A1 | 9/2017 | Ueda et al. | |
| 2018/0216811 A1* | 8/2018 | Fukakusa | F21S 2/00 |

FOREIGN PATENT DOCUMENTS

| | | |
|---|---|---|
| JP | 2006324658 A | 11/2006 |
| WO | 2016103547 A1 | 6/2016 |

\* cited by examiner

LIGHT SOURCE DEVICE

CROSS-REFERENCE TO RELATED APPLICATION

This application claims the benefit of Japanese Patent Application No. 2017-116926 filed on Jun. 14, 2017. The entire disclosure of Japanese Patent Application No. 2017-116926 is incorporated by reference herein.

BACKGROUND

1. Technical Field

The present disclosure relates to a light source device, and particularly to a light source device including a semiconductor laser.

2. Description of Related Art

Among light source devices including semiconductor lasers, a light source device has been proposed in which a reflecting surface inclined with respect to an upper surface of a base member, on which a semiconductor laser is mounted, is provided to emit light emitted from the semiconductor laser in a direction substantially perpendicular to the upper surface of the base member (see, for example, WO 2016/103547). In this light source device, a bonding film composed of a metal film and formed on a spacer having the inclined reflecting surface and a bonding film composed of a metal film and formed on the upper surface of the base member are connected to each other by a molten metal to attach the spacer to the base member.

SUMMARY

In the light source device described in WO 2016/103547, end portions of the bonding films formed on a lower surface of the spacer and an upper surface of the base member are disposed separately from a lower end portion of the reflecting surface so that the molten metal squeezed out from a gap between the bonding film formed on the lower surface of the spacer and the bonding film formed on the upper surface of the base member is prevented from being deposited on the reflecting surface of the spacer when the spacer is attached to the base member. Meanwhile, the end portions of the bonding film formed on the spacer at an upper side and the bonding film on the base member at a lower side are disposed so as to be aligned in an upper-lower direction. Accordingly, the molten metal squeezed out from a gap between both the bonding layers may be projected to a lateral side of the bonding films, leading to formation of a so-called solder ball.

When a part of the molten metal is brought into contact with the lower end portion of the reflecting surface during melting of the metal, the molten metal creeps up on the reflecting surface, so that functions of the reflecting surface may be hindered.

The present disclosure has been made in view of the problems described above, and an object of the present disclosure is to provide a light source device in which a reflecting surface inclined with respect to an upper surface of a base member, on which a semiconductor laser is mounted, is provided, the reflecting surface having a high reflectance.

A light source device according to one embodiment of the present invention includes: a base member; a semiconductor laser mounted on an upper surface of the base member; a lateral wall portion having: a lower surface facing the upper surface of the base member and being a non-reflecting surface, and a reflecting surface that reflects light emitted from the semiconductor laser, is connected to the lower surface of the lateral wall portion at a lower end portion of the reflecting surface, and is inclined with respect to the upper surface of the base member; a first bonding film that is a metal film disposed in a region on the upper surface of the base member facing the lower surface of the lateral wall portion; a second bonding film that is a metal film disposed on the lower surface of the lateral wall portion; and a metal bonding member fuse-bonded to the first bonding film and the second bonding film to each other. An end portion of the first bonding film at a reflecting-surface side and an end portion of the second bonding film at the reflecting-surface side are located separately from the lower end portion of the reflecting surface. A distance between the end portion of the first bonding film at the reflecting-surface side and the lower end portion of the reflecting surface is different from a distance between the end portion of the second bonding film at the reflecting-surface side and the lower end portion of the reflecting surface.

According to the embodiment described above, a light source device can be provided in which a reflecting surface inclined with respect to an upper surface of a base member, on which a semiconductor laser is mounted, is provided, the reflecting surface having a high reflectivity.

DETAILED DESCRIPTION OF EMBODIMENTS

Figure 1:
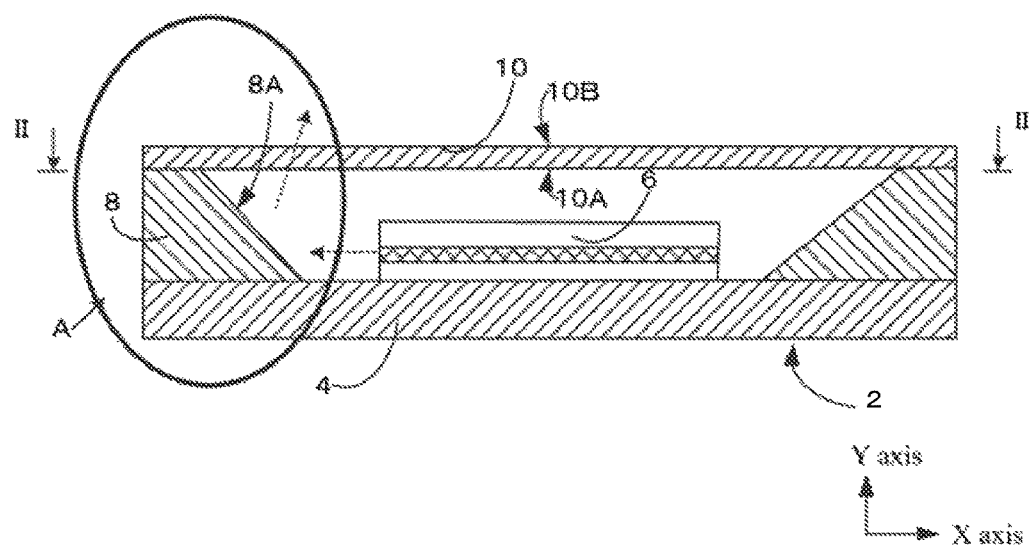
FIG. 1 is a schematic side cross-sectional view showing a general structure of a light source device according to first and second embodiments of the present disclosure.

Hereinafter, various embodiments for carrying out the present disclosure will be described with reference to the drawings. In the drawings, corresponding members having the same function are given the same numerals. In consideration of ease of explaining or understanding the main points, embodiments will be shown separately for the sake of convenience, but configurations shown in different embodiments can be partially replaced or combined. In a third embodiment and subsequent embodiments, description of the same matters as in first and second embodiments will be omitted, and only different matters will be described. In particular, like effects obtained by like configurations will not be mentioned repeatedly for each embodiment.

The following descriptions are based on the premise that a base member is mounted on a horizontal surface, and the base member and a cover are disposed on the lower side and on the upper side, respectively. In particular, a horizontal direction from the left side to the right side on the drawing is referred to as a "+ direction on the X axis", and a vertical direction from the lower side to the upper side on the drawing is referred to as a "+ direction on the Y axis".

Light Source Device According to First and Second Embodiments

Figure 2:
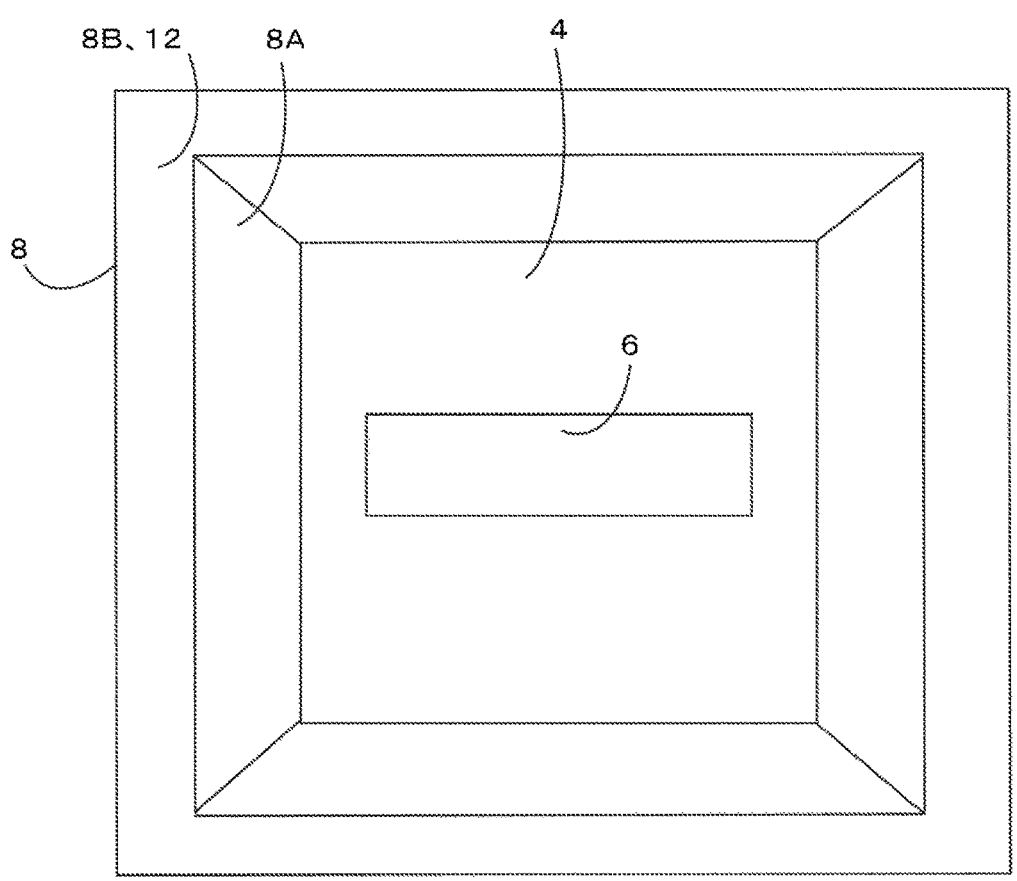
FIG. 2 is a view (plan view) viewed in a direction indicated by arrows II-II in FIG. 1.

A general structure of a light source device according to first and second embodiments of the present invention will be described with reference to FIGS. 1 and 2. FIG. 1 is a schematic side cross-sectional view showing the general structure of the light source device according to first and second embodiments of the present invention. FIG. 2 is a view (plan view) viewed in a direction indicated by arrows II-II in FIG. 1.

A light source device 2 according to the first and second embodiments includes a base member 4, a semiconductor laser 6 disposed on an upper surface of the base member 4, a lateral wall portion 8 surrounding the semiconductor laser 6, and a light-transmissive cover 10 covering a gap surrounded by the base member 4 and the lateral wall portion 8. The lateral wall portion 8 has reflecting surfaces, which are inner surfaces 8A connected to an upper surface 8B, and the reflecting surfaces are inclined so that light emitted from the semiconductor laser 6 is reflected by the reflecting surfaces toward the cover 10 (see dotted line arrows in FIG. 1). As described later, a metal film is formed on each of the inner surfaces 8A to form reflecting surfaces. The expression "light reflected toward the cover 10" refers to a reflected light advancing toward the cover in an appropriate direction including a perpendicularly-upward vector component.

A connection member 12 for airtightly connecting the upper surface 8B of the lateral wall portion 8 and a lower surface 10A of the cover 10 is disposed over an entire perimeter of the upper surface 8B of the lateral wall portion 8. The base member 4 and the lateral wall portion 8 are also airtightly bonded to each other. Accordingly, the semiconductor laser 6 mounted in a package including the base member 4 and the lateral wall portion 8 can be airtightly enclosed by the cover 10. This allows for providing the light source device 2 in which the semiconductor laser 6 is airtightly enclosed to improve durability, and light can be extracted from the cover 10.

As shown in FIG. 2, in plan view where the package is viewed from above, the base member 4 that forms the package has a substantially rectangular shape, and the lateral wall portion 8 has four inner surfaces 8A that define a recess, in which the semiconductor laser 6 is housed, together with the base member 4. Four upper edges that serve as boundaries between the inner surfaces 8A and the upper surface 8B of the lateral wall portion 8 form a substantially rectangular shape. Similarly, four lower edges that serve as boundaries between the inner surfaces 8A of the lateral wall portion 8 and the base member 4 form a substantially rectangular shape. Accordingly, the base member 4 and the four inside surfaces (reflecting surfaces) 8A of the lateral wall portion 8 define a substantially quadrangular pyramid-shaped recess which is narrower at the lower side, i.e. a substantially quadrangular pyramid-shaped recess in which each of the lower edges is shorter than a corresponding one of the upper edges.

In the first and second embodiments, the lateral wall portion 8 is formed to surround the semiconductor laser 6, and the reflecting surface at the inner surface 8A is formed to surround the semiconductor laser 6, so that the lateral wall portion 8 also functions as a part of the package. This allows downsizing of the light source device. Alternatively, a light source device according to another embodiment may include a lateral wall portion that functions as a raised mirror in addition to constituent members of the package as described below (see, for example, FIGS. 9 and 10).

In the first and second embodiments, the base member 4 having a substantially rectangular shape in plan view and the four inner surfaces 8A of the lateral wall portion 8 defines a substantially quadrangular pyramid-shaped recess, but the recess may have any appropriate shape such as a trigonal pyramid shape, any polygonal pyramid shape having five or more angles, or a cone shape. The shape of the base member 4 in plan view may be a square shape, a triangular shape, a polygonal shape having five or more corners, or a circular shape. In the first and second embodiments, the lateral wall portion 8 is formed at an outer edge side of the base member 4, and an outer shape of the base member 4 corresponds to an outer shape of the lateral wall portion 8, but the lateral wall portion 8 is not limited thereto. The base member 4 may extend further outward of the outer periphery of the lateral wall portion 8 as long as the lateral wall portion 8 is formed to surround the semiconductor laser 6. Alternatively, a plurality of lateral wall portions 8 may be formed on a single base member 4.

In the first and second embodiments, the base member 4 and the lateral wall portion 8 are formed of individual members, and therefore an optimal material can be employed for each of the base member 4 and the lateral wall portion 8 according to a use of each of the members. In the first and second embodiments, aluminum nitride is used as a material of the base member 4. The material of the base member 4 is not limited thereto, and other ceramic materials such as alumina, alumina-zirconia or silicon nitride, resin materials, single crystals of silicon or the like, metal materials provided with an insulating layer or the like can also be used.

In the first and second embodiments, silicon is used as a material of the lateral wall portion 8. In this case, the angle of the inside surface 8A can be defined by the crystal orientation of silicon, and therefore a reflecting surface having a precise inclination angle can be easily formed. For example, when the <100> surface of single crystal silicon is etched by anisotropic etching, a <111> surface having an angle of 54.7° appears, and the <111> surface can serve as the inside surface 8A.

Thus, in the first and second embodiments, the lateral wall portion 8 is formed of silicon, which allows for obtaining a reflecting surface having a desired inclination angle with high accuracy. A material of the lateral wall portion 8 is not limited to silicon, and other materials such as resin materials, ceramic materials, metals provided with an insulating layer, glass or the like can also be used for the lateral wall portion 8.

In the first and second embodiments, light-transmissive glass is used as a material of the light-transmissive cover, but a material of the light-transmissive cover is not limited thereto, and quartz, sapphire or the like can also be used.

In the first and second embodiments, aluminum or an aluminum alloy is used as a material of the connection member 12. For the connection member 12, other appropriate material such as other metal materials such as titanium, resin materials, ceramic materials, eutectic crystal materials can alternatively be used.

In the first and second embodiments, a nitride semiconductor laser is used for the semiconductor laser 6, and the emission wavelength of the semiconductor laser 6 is a wavelength of ultraviolet light to green light. Alternatively, for the semiconductor laser 6, a red or infrared semiconductor laser can also be used.

Bonding Structure of Lateral Wall Portion According to First Embodiment

Figure 3:
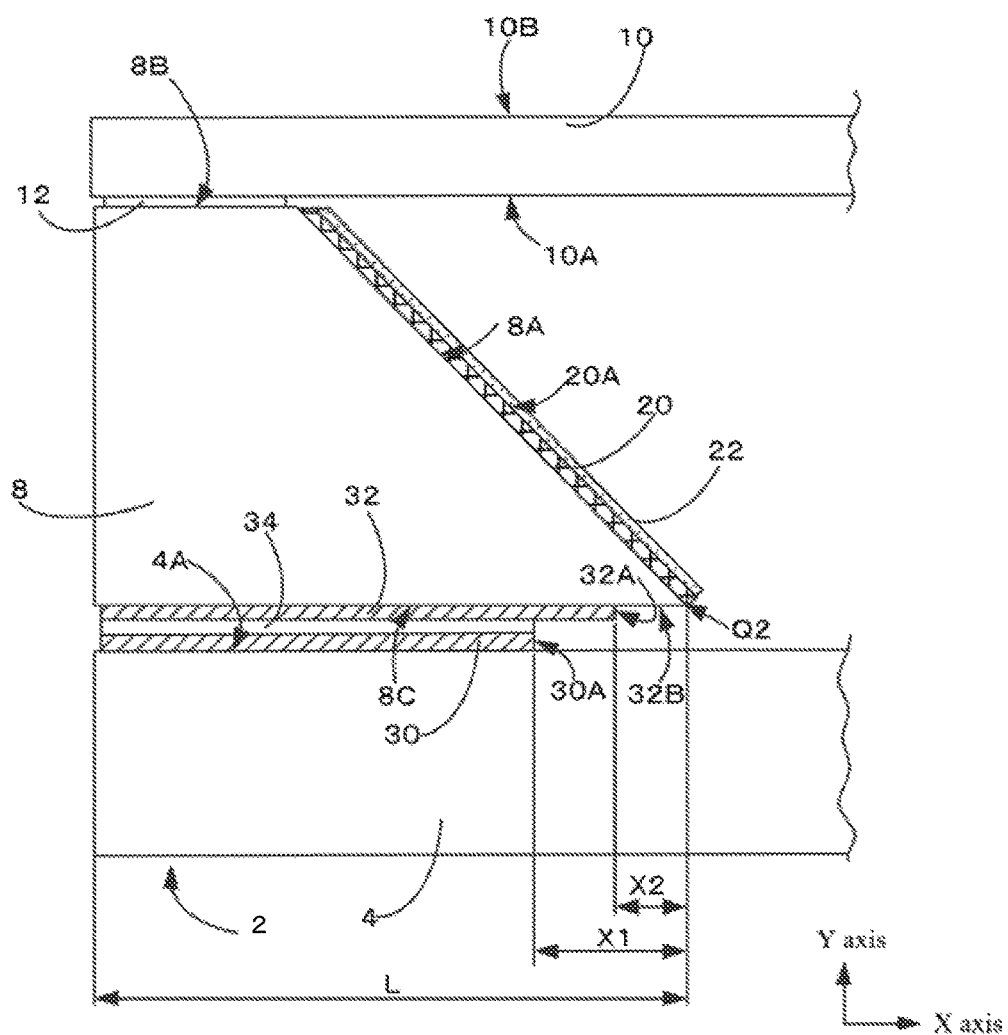
FIG. 3 is an enlarged side cross-sectional view showing a region indicated by A in FIG. 1, and shows a bonding structure of a lateral wall portion according to a first embodiment of the present disclosure.

A bonding structure of the lateral wall portion according to the first embodiment of the present disclosure will now be described with reference to FIG. 3. FIG. 3 is a side cross-sectional view showing an enlarged form of a region indicated by A in FIG. 1, and shows the bonding structure of the lateral wall portion in the light source device according to the first embodiment. In FIG. 3, comparing with FIG. 1, bonding films 30 and 32 and a metal bonding member 34 are formed for airtightly bonding the base member 4 and the lateral wall portion 8, and a reflecting film 20 and a dielectric film 22 are formed so that the inner surface 8A of the lateral wall portion 8 serves as a reflecting surface.

Bonding of Base Member and Lateral Wall Portion

In the first embodiment, the light source device includes a first bonding film 30, which is a metal film disposed on a region of an upper surface 4A of the base member 4 facing a lower surface 8C of the lateral wall portion 8; a second bonding film 32, which is a metal film formed on a lower surface 8C, which is a non-metal surface, of the lateral wall portion 8; and the metal bonding member 34 that melt-bonds the first bonding film 30 and the second bonding film 32 to each other. Even if a metal is used as a material of the lateral wall portion 8, with a non-metal film disposed on a surface of the lateral wall portion 8, the lower surface 8C of the lateral wall portion 8 can be a non-metal surface. For example, in the case where an oxide film, which is a non-metal film, is disposed on a surface of the lateral wall portion 8 for which aluminum is used, the lower surface 8C of the lateral wall portion 8 corresponds to a non-metal surface.

When aluminum nitride is used as a material of the base member 4 as described above, the region of the upper surface 4A of the base member 4 facing the lower surface 8C of the lateral wall portion 8 is a non-metal surface. Alternatively, in the case where a metal material is used as a material of the base member 4 together with an insulating layer, a region of the upper surface 4A of the base member 4 facing the lower surface 8C of the lateral wall portion 8 may be a metal surface.

The first and second bonding films 30 and/or 32 may have a layered structure of different metal films. For example, for bonding the base member 4 and the lateral wall portion 8, on a region of the upper surface of the base member 4 to which the lateral wall portion 8 is to be attached, the bonding film 30 is disposed which includes a layered structure including a first layer composed of a film containing any of titanium (Ti), nickel (Ni), and chromium (Cr) and a second layer, which is optionally provided, containing platinum (Pt) (i.e., the second layer may be omitted), and a third layer (bonding layer) disposed on the layered structure and composed of a film containing gold (Au). Each of the first and second bonding films 30 and 32 may include a layer having a film containing platinum.

Similarly, on the lower surface of the lateral wall portion 8, the bonding film 32 is disposed which includes a layered structure including a first layer composed of a film containing any of titanium (Ti), nickel (Ni) and chromium (Cr) and a second layer, which is optionally disposed, containing platinum (Pt) (i.e., the second layer may not be disposed), and a third layer (bonding layer) disposed on the layered structure and composed of a film containing gold (Au). With the bonding films 30 and 32 each including a barrier layer of platinum (Pt), a bonding structure between a base member and a lateral wall portion which is stable for a long period of time can be obtained.

A thickness of each of the bonding films 30 and 32 may be, for example, about 0.3 to 2 µm.

The bonding film 30 formed at the base member 4 side and the bonding film 32 formed on the lateral wall portion 8 side are metal-fusion-bonded using the metal bonding member 34 of a solder material containing tin (Sn). Gold-tin (Au—Sn) can also be used as the metal bonding member 34. This allows for obtaining a strong bonding structure between the base member 4 and the lateral wall portion 8 which is stable for a long period of time.

Reflecting Film

On the inner surface 8A of the lateral wall portion 8, the reflecting film 20 is disposed which includes a layered structure including a first layer composed of a film containing any of titanium (Ti), nickel (Ni) and chromium (Cr) and a second layer, which is optionally provided, containing platinum (Pt) (i.e., the second layer may be omitted), and a third layer (i.e., reflecting layer) disposed on the layered structure and composed of, for example, a film containing silver (Ag). That is, the outer surface of the reflecting film 20 formed on the inside surface 8A of the lateral wall portion 8 serves as a reflecting surface 20A. A thickness of the reflecting film 20 may be, for example, in a range of approximately 0.3 to 2 µm.

In this embodiment, a film containing silver is formed as the reflecting film 20, and therefore the reflecting surface 20A with a high reflectance can be obtained. Meanwhile, the third layer that forms the reflecting surface is not limited to a metal film containing silver (Ag), and for example, a metal film containing aluminum (Al) can be alternatively used.

Further, the dielectric film 22 including silicon dioxide ($SiO_2$), titanium dioxide ($TiO_2$) or the like is disposed on the reflecting surface 20A of the reflecting film 20. The dielectric film 22 may be a single layer, or may be a multilayer film in which layers having different refractive indices are stacked. Selecting appropriate materials to be stacked and a thickness of the dielectric film 22 allows the dielectric film 22 to function as a good reflecting film. The reflectance of the reflecting surface can be effectively increased with the dielectric film 22 functioning as a reflecting film.

As described above, the reflecting film 20 containing silver (Ag) or aluminum (Al), and the dielectric film 22 are disposed on the reflecting surface, and therefore a reflecting surface having a high reflectance can be obtained.

Bonding of Lateral Wall Portion and Cover

Bonding of the upper surface 8B of the lateral wall portion 8 and the lower surface 10A of the cover 10 will be described.

In this embodiment, by sputtering or vapor deposition, the connection member 12 made of aluminum or an aluminum alloy is formed on the upper surface 8B of the lateral wall portion 8 made of silicon. The upper surface of the formed connection member 12 and the lower surface 10A of the cover 10 are bonded by anodic bonding. The connection member 12 may not be formed, and in the case where the connection member 12 is not formed, the upper surface 8B of the lateral wall portion 8 made of silicon and the lower surface 10A of the cover 10 are bonded by anodic bonding.

In anodic bonding, glass and metal, or glass and silicon are brought into contact with each other, and heated to activate ions present in the glass, and thereafter, in a state where the metal or silicon, i.e. the lateral wall portion 8 serves an anode, a predetermined voltage is applied between the glass and the metal or the glass and the silicon, so that ions are moved to perform bonding. By the anodic bonding, materials having considerably different properties, such as glass and metal, or glass and silicon can be bonded without use of an interposing member such as solder or an adhesive. Bonding can be performed by anodic bonding using titanium or a titanium alloy in place of aluminum or an aluminum alloy as a material of the connection member 12.

As described above, the connection member 12 and the cover 10 can be bonded by anodic bonding, which allows airtight and firm bonding.

Distance Between End Portion of Bonding Film and Lower End Portion of Reflecting Surface The bonding structure of the lateral wall portion according to the first embodiment will be described with reference to FIG. 3. In this embodiment, each of an end portion (i.e., end surface) 30A of the first bonding film 30 at a reflecting surface 20A side and an end portion (i.e., end surface) 32A of the second bonding film 32 at the reflecting surface 20A side is located separately from a lower end portion Q2 of the reflecting surface 20A. A distance X1 between the end portion (i.e., end surface) 30A of the first bonding film 30 at the reflecting surface 20A side and the lower end portion Q2 of the reflecting surface 20A is different from a distance X2 between the end portion (i.e., end surface) 32A of the second bonding film 32 at the reflecting surface 20A side and the lower end portion Q2 of the reflecting surface 20A.

In the first embodiment, the distance X1 between the end portion (i.e., end surface) 30A of the first bonding film 30 at the reflecting surface 20A side and the lower end portion Q2 of the reflecting surface 20A is longer than the distance X2 between the end portion (i.e., end surface) 32A of the second bonding film 32 at the reflecting surface 20A side and the lower end portion Q2 of the reflecting surface 20A.

Figure 5:
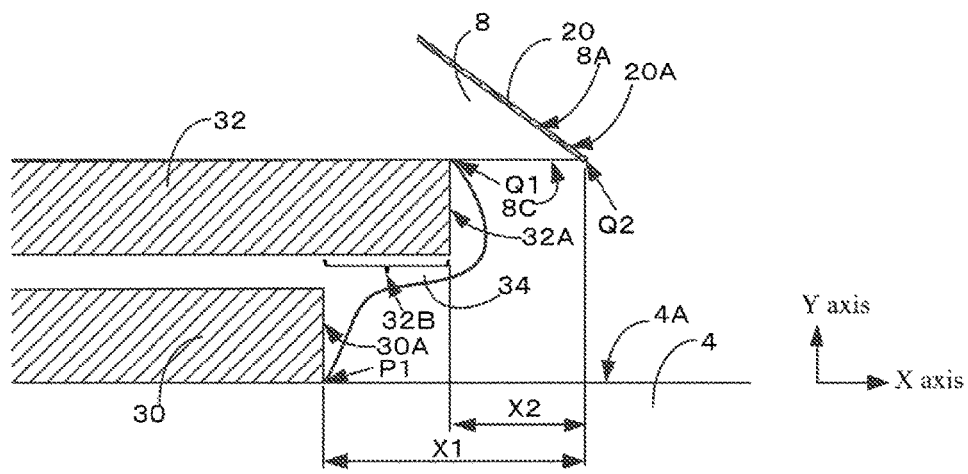
FIG. 5 is a side cross-sectional view schematically showing a shape of a formed metal bonding member in the bonding structure of the lateral wall portion according to the first embodiment of the present disclosure.
Figure 7:
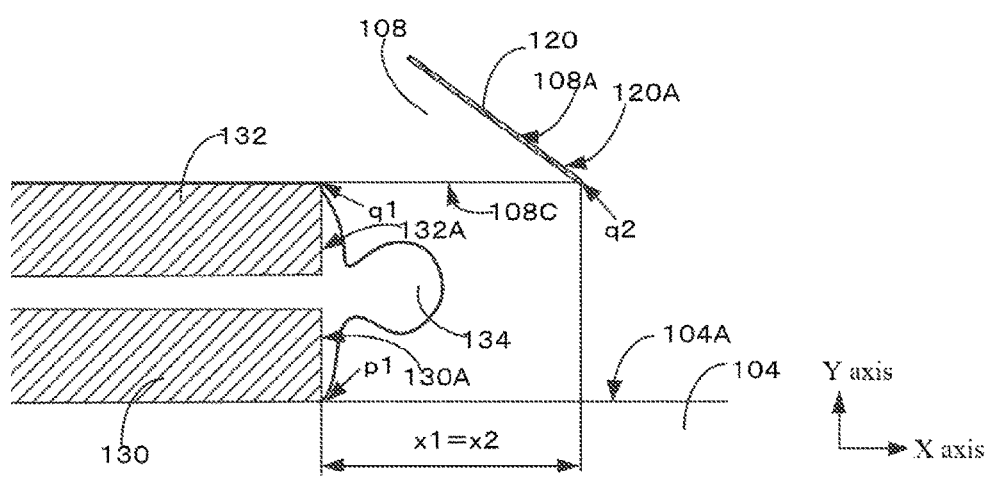
FIG. 7 is a side sectional view schematically showing a shape of a formed metal bonding member in a bonding structure of a lateral wall portion in a comparative example.

The bonding structure of the lateral side portion according to the first embodiment will be described further in detail with reference to FIGS. 5 and 7. FIG. 5 is a side cross-sectional view schematically showing a shape of the metal bonding member in the bonding structure of the lateral wall portion according to the first embodiment. FIG. 7 is a side cross-sectional view schematically showing a shape of the metal bonding member in the bonding structure of the lateral wall portion shown as a comparative example.

Comparative Example

First, the comparative example shown in FIG. 7 will be described. In the comparative example, an end portion (end surface) 130A of a first bonding film 130 at a reflecting surface 120A side disposed on an upper surface 104A of a base member 104 is located separately from a lower end portion q2 of a reflecting surface 120A, and an end portion (end surface) 132A of a second bonding film 132 at a reflecting surface 120A side disposed on a lower surface 108C of a lateral wall portion 108 is located separately from the lower end portion q2 of the reflecting surface 120A.

In the comparative example, on the other hand, a distance x1 between the end portion (i.e., end surface) 130A of the first bonding film 130 at the reflecting surface 120A side and the lower end portion q2 of the reflecting surface 120A is the same as a distance x2 between the end portion (i.e., end surface) 132A of the second bonding film 132 at the reflecting surface 120A side and the lower end portion q2 of the reflecting surface 120A. That is, the end portion (i.e., end surface) 130A of the first bonding film 130 at the reflecting surface 120A side and the end portion (i.e., end surface) 132A of the second bonding film 132 at the reflecting surface 120A side are located at positions aligned in an upper-lower direction.

In this case, as shown in FIG. 7, a molten metal (i.e., metal bonding member) 134 squeezed out in a + direction on the X axis from a gap between the first bonding film 130 and the second bonding film 132 during bonding of the base member 104 and the lateral wall portion 108 flows in − direction on the Y axis over the end portion (i.e., end surface) 130A of the first bonding film 130 being a metal film, and flows in a + direction on the Y axis over the end portion (i.e., end surface) 132A of the second bonding film 132, which is a metal film. Due to wettability, the molten metal (i.e., metal bonding member) 134 is generally repelled from the upper surface 104A, which is a non-metal surface, of the base member 104 and the lower surface 108C, which is a non-metal surface, of the lateral wall portion 108, and therefore the flow of the molten metal stops at locations indicated by p1 and q1 in FIG. 7.

The lengths of the end portions (end surfaces) 130A and 132A, which are the thickness dimensions of the first bonding film 130 and the second bonding film 132, respectively, are greatly limited, and therefore as shown in FIG. 7, much of the molten metal (metal bonding member) 134 that is squeezed out is projected toward a lateral side of the first bonding film 130 and a lateral side of the second bonding film 132, and solidified, leading to formation of a so-called solder ball.

Thus, if a tip of the molten metal is brought into contact with the lower end portion q2 of the reflecting surface 120A, the molten metal is wet-spread upward on the reflecting surface 120A or between the reflecting surface 120A and the lateral wall portion 108, which may hinder functions of the reflecting surface 120A. Further, the solidified solder ball is a very unstable cantilever-like support structure, and thus the solder ball may be brought into contact with the upper surface 104A of the base member 104 due to impact applied during a subsequent process of manufacturing a light source device or during handling of the light source device by a user, or due to generation of heat during operation of the light source device, which may lead to occurrence of a short-circuit etc.

First Embodiment

In the first embodiment, each of the end portion (i.e., end surface) 30A of the first bonding film 30 at the reflecting surface 20A side and the end portion (i.e., end surface) 32A of the second bonding film 32 at reflecting surface 20A side is located separately from the lower end portion Q2 of the reflecting surface 20A as shown in FIG. 5. Further, the distance X1 between the end portion (i.e., end surface) 30A of the first bonding film 30 at the reflecting surface 20A side and the lower end portion Q2 of the reflecting surface 20A is different from the distance X2 between the end portion (i.e., end surface) 32A of the second bonding film 32 at the reflecting surface 20A side and the lower end portion Q2 of the reflecting surface 20A. In particular, in the first embodiment, the distance X1 between the end portion (i.e., end surface) 30A of the first bonding film 30 at the reflecting surface 20A side and the lower end portion Q2 of the reflecting surface 20A is longer than the distance X2 between the end portion (i.e., end surface) 32A of the second bonding film 32 at the reflecting surface 20A side and the lower end portion Q2 of the reflecting surface 20A. That is, the second bonding film 32 at the upper side extend farther toward the reflecting surface 20A side than the first bonding film 30 on the lower side extends.

The molten metal (i.e., metal bonding member) 34 squeezed out from a gap between the first bonding film 30 and the second bonding film 32 during bonding of the base member 4 and the lateral wall portion 8 flows in a − direction on the Y axis over the end portion (i.e., end surface) 30A of the first bonding film 30, which is a metal film, and due to wettability, the molten metal is generally repelled from the upper surface 4A of the base member 4, which is a non-metal surface, so that the flow of the molten metal stops at a location indicated by P1 in FIG. 5.

On the other hand, the molten metal (i.e., metal bonding member) 34 flowing toward the second bonding film 32 at the upper side flows in a + direction on the X axis over a horizontal lower surface 32B of the second bonding film 32, which is a metal film, and subsequently flows in a + direction on the Y axis over the end portion (i.e., end surface) 32A of the second bonding film 32. Due to wettability, the molten metal is repelled from the lower surface 8C of the lateral wall portion 8, which is a non-metal surface, so that the flow of the molten metal stops at a location indicated by Q1 in FIG. 5.

According to the first embodiment, much of the molten metal (i.e., metal bonding member) 34 that is squeezed out can be accommodated on the lower surface 32B of the second bonding film 32, which is a horizontal surface. Thus, a fillet shape can be formed along the end portion (i.e., end surface) 30A of the first bonding film 30 and the lower surface 32B and the end portion (i.e., end surface) 32A of the second bonding film 32 without forming a solder ball.

If the upper surface 4A of the base member 4 which is connected to the first bonding film 30 at the spot P1 is a metal surface, the molten metal (metal bonding member) 34 may also flow to the upper surface 4A of the base member 4. However, the flow of the molten metal stops at a boundary with an insulating region provided at the upper surface 4A of the base member 4, so that occurrence of failures such as a short-circuit can be prevented.

As described above, in the first embodiment, the distance X1 between the end portion (i.e., end surface) 30A of the first bonding film 30 at the reflecting surface 20A side and the lower end portion Q2 of the reflecting surface 20A is different from the distance X2 between the end portion (i.e., end surface) 32A of the second bonding film 32 at the reflecting surface 20A side and the lower end portion Q2 of the reflecting surface 20A, and therefore much of the molten metal (metal bonding member) 34 squeezed out from a gap between the first bonding film 30 and the second bonding film 32 during bonding of the base member 4 and the lateral wall portion 8 can be accommodated on the lower surface 32B of the second bonding film 32. Thus, a solder ball having an unstable cantilever-like support structure is not formed, and the base member 4 and the lateral wall portion 8 can be firmly bonded to each other with a fillet structure.

Each of the end portions (i.e., end surfaces) 30A and 32A of the first bonding film 30 and the second bonding film 32 at the reflecting surface side is disposed separately from the lower end portion Q2 of the reflecting surface 20A, so that the molten metal (metal bonding member) 34 does not creep onto the reflecting surface 20A, and reduction in the reflectance of the reflecting surface 20A can be prevented.

As described above, according to the first embodiment, the light source device 2 with high reliability can be provided having the reflecting surface 20A of a high reflectance inclined with respect to the upper surface 4A of the base member 4 on which the semiconductor laser 6 is mounted. In plan view where the light source device is seen from above, the distance X1 between the end portion (i.e., end surface) 30A of the first bonding film 30 at the reflecting surface 20A side and the lower end portion Q2 of the reflecting surface 20A may not necessarily be different from the distance X2 between the end portion (i.e., end surface) 32A of the second bonding film 32 at the reflecting surface 20 side and the lower end portion Q2 of the reflecting surface 20A in the whole region. As long as an area sufficient for accommodating the molten metal (i.e., metal bonding member) 34 squeezed out from a gap between the first boding film 30 and the second bonding film 32 can be secured at the lower surface 32B of the second bonding film 32, the distance X1 may be the same as the distance X2 in a part of the region.

Difference Between Distance X1 and Distance X2

It is preferable that a difference between the distance X1 between the end portion (i.e., end surface) 30A of the first bonding film 30 at the reflecting surface 20A side and the lower end portion Q2 of the reflecting surface 20A and the distance X2 between the end portion (i.e., end surface) 32A of the second bonding film 32 at the reflecting surface 20A side and the lower end portion Q2 of the reflecting surface 20A, i.e. a length of the lower surface 32B of the second bonding film 32 which accommodates much of the molten metal (i.e., metal bonding member) 34 that is squeezed out, is selected according to the amount of the molten metal (i.e., metal bonding member) 34 to be charged between the first bonding film 30 and the second bonding film 32 during bonding.

With the length of the lower surface 32B of the second bonding film 32, on which much of the molten metal (i.e., metal bonding member) 34 squeezed out from a gap between the first bonding film 30 and the second bonding film 32 is accommodated, selected according to the amount of the molten metal (i.e., metal bonding member) 34, it is possible to form a fillet structure in which a solder ball is not generated.

In further detail, the amount of the metal bonding member 34 disposed between the first bonding film 30 and the second bonding film 32 to bond both the first and second bonding films 30, 32 to each other corresponds to a length L of the lower surface 8C of the lateral wall portion 8 (see FIGS. 3, 4, 11 and 12). Thus, it is preferable that the length of the lower surface 32B of the second bonding film 32 which accommodates much of the molten metal (i.e., metal bonding member) 34 that is squeezed out (i.e. the value of X1−X2) is selected according to the length L of the lower surface 8C of the lateral wall portion 8 (see FIG. 3).

More specifically, the difference (X1−X2) between the distance X1 between the end portion (i.e., end surface) 30A of the first bonding film 30 at the reflecting surface 20A side and the lower end portion Q2 of the reflecting surface 20A and the distance X2 between the end portion (i.e., end surface) 32A of the second bonding film 32 at the reflecting surface 20A side and the lower end portion Q2 of the reflecting surface 20A is preferably in a range of approximately 5 to 20%, more preferably approximately 10 to 15%, of the length L of the lower surface 8C of the lateral wall portion 8 (see FIG. 3).

Figure 4:
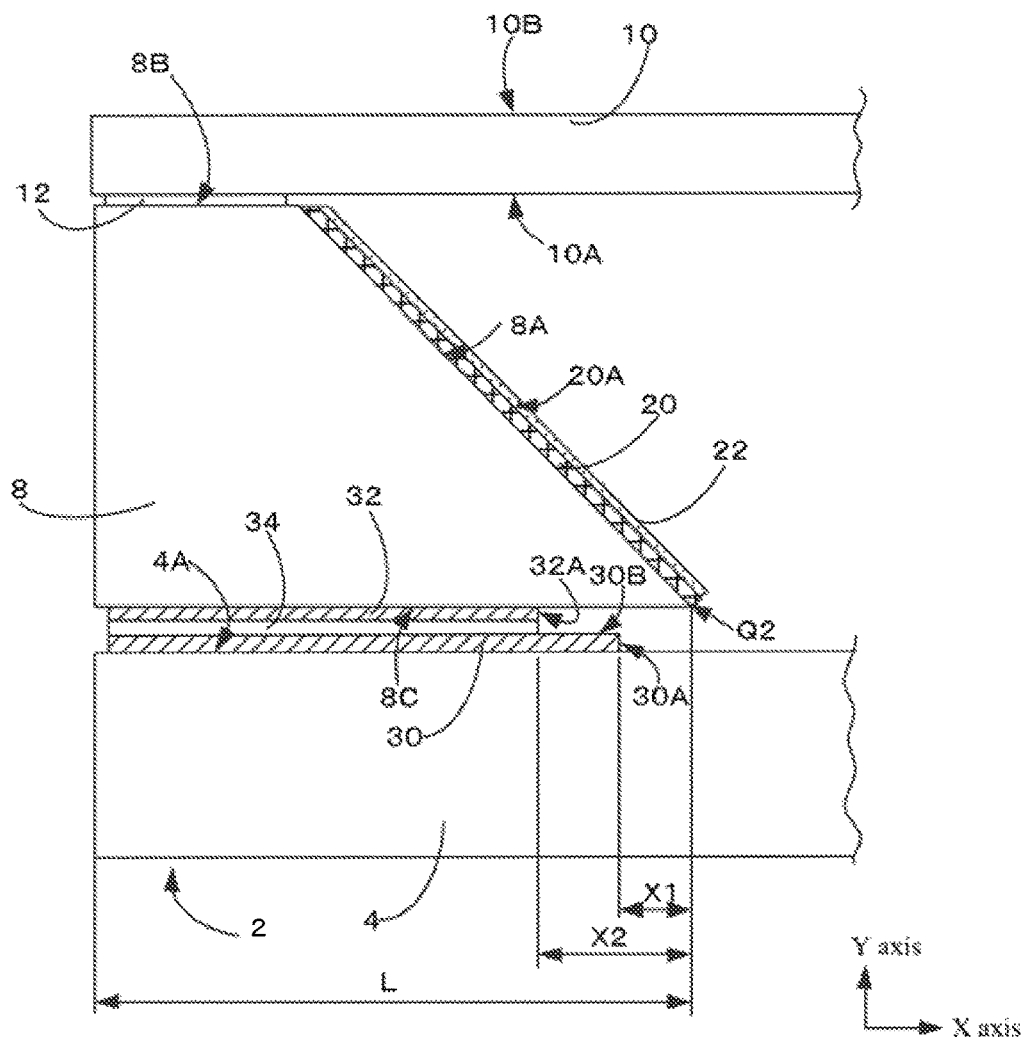
FIG. 4 is an enlarged side cross-sectional view showing the region indicated by A in FIG. 1, and shows a bonding structure of a lateral wall portion according to a second embodiment of the present disclosure.

Description of Bonding Structure of Lateral Wall Portion According to Second Embodiment A bonding structure of a lateral wall portion according to the second embodiment of the present invention will be described with reference to FIG. 4. FIG. 4 is an enlarged side cross-sectional view showing the region indicated by B in FIG. 1, and shows the bonding structure of the lateral wall portion in a light source device according to the second embodiment.

In the second embodiment, each of an end portion (i.e., end surface) 30A of a first bonding film 30 at a reflecting surface 20A side and an end portion (i.e., end surface) 32A of a second bonding film 32 at the reflecting surface 20A side is disposed separately from a lower end portion Q2 of a reflecting surface 20A as in the first embodiment. In addition, a distance X1 between the end portion (i.e., end surface) 30A of the first bonding film 30 at the reflecting surface 20A side and the lower end portion Q2 of the reflecting surface 20A is different from a distance X2 between the end portion (i.e., end surface) 32A of the second bonding film 32 at the reflecting surface 20A side and the lower end portion Q2 of the reflecting surface 20A.

On the other hand, in the second embodiment, the distance X2 between the end portion (i.e., end surface) 32A of the second bonding film 32 at the reflecting surface 20A side and the lower end portion Q2 of the reflecting surface 20A is longer than the distance X1 between the end portion (i.e., end surface) 30A of the first bonding film 30 at the reflecting surface 20A side and the lower end portion Q2 of the reflecting surface 20A. That is, the distance X1 is larger than the distance X2 in the first embodiment, whereas the distance X2 is larger than the distance X1 in the second embodiment.

Figure 6:
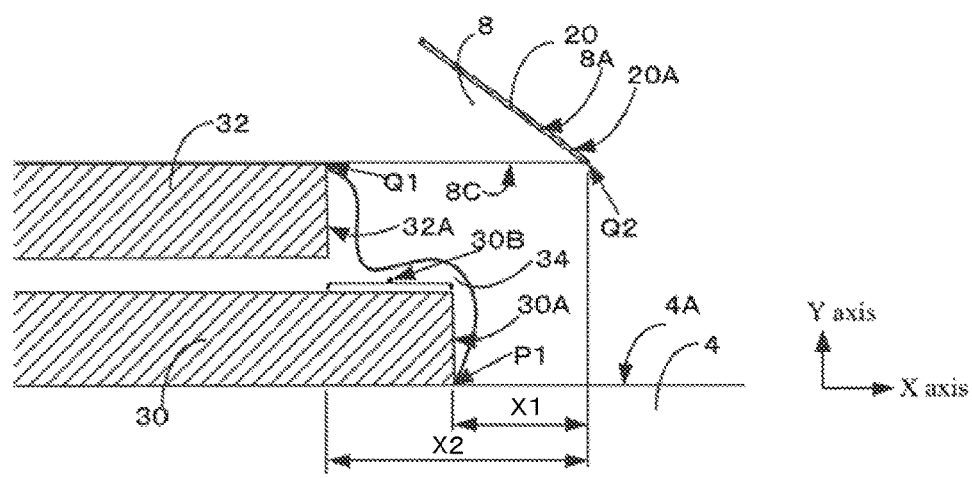
FIG. 6 is a side cross-sectional view schematically showing a shape of a formed metal bonding member in the bonding structure of the lateral wall portion according to the second embodiment of the present disclosure.

The bonding structure of the lateral wall portion according to the second embodiment will be described further in detail with reference to FIG. 6. FIG. 6 is a side cross-sectional view schematically showing a shape of a formed metal bonding member in a bonding structure of the lateral wall portion according to the second embodiment. The second embodiment will be described below with reference to the above-described comparative example shown in FIG. 7.

Second Embodiment

In the second embodiment, each of the end portion (i.e., end surface) 30A of the first bonding film 30 at the reflecting surface 20A side and the end portion (i.e., end surface) 32A of the second bonding film 32 at the reflecting surface 20A side is located separately from the lower end portion Q2 of the reflecting surface 20A as shown in FIG. 6. Further, the distance X1 between the end portion (i.e., end surface) 30A of the first bonding film 30 at the reflecting surface 20A side and the lower end portion Q2 of the reflecting surface 20A is different from the distance X2 between the end portion (i.e., end surface) 32A of the second bonding film 32 at the reflecting surface 20A side and the lower end portion Q2 of the reflecting surface 20A. In particularly, in the second embodiment, the distance X2 is longer than the distance X1. That is, the first bonding film 30 at the lower side extends farther toward the reflecting surface 20A side than the second bonding film 32 at the upper side extends.

The molten metal (i.e., metal bonding member) 34 squeezed out from a gap between the first bonding film 30 and the second bonding film 32 during bonding of the base member 4 and the lateral wall portion 8 flows in a + direction on the X axis over a horizontal upper surface 30B of the first bonding film 30, which is a metal film, and subsequently flows in a − direction on the Y axis over the end portion (i.e., end surface) 30A of the first bonding film 30. Then, due to wettability, the molten metal is generally repelled from the upper surface 4A of the base member 4, which is a non-metal surface, so that the flow of the molten metal stops at a location indicated by P1 in FIG. 6.

On the other hand, the molten metal (i.e., metal bonding member) 34 flowing toward the second bonding film 32 at the upper side flows in a + direction on the Y axis over the end portion (i.e., end surface) 30A of the second bonding film 32, which is a metal film, and due to wettability, the molten metal is repelled from the lower surface 8C of the lateral wall portion 8, which is a non-metal surface, so that the flow of the molten metal stops at a location indicated by Q1 in FIG. 6.

According to the second embodiment, much of the molten metal (metal bonding member) 34 that is squeezed out can be accommodated on the upper surface 30B of the first bonding film 30, which is a horizontal surface. Thus, a fillet shape can be formed along the upper surface 30B and the end portion (i.e., end surface) 30A of the first bonding film 30 and the end portion (i.e., end surface) 32A of the second bonding film 32 without forming a solder ball having an unstable cantilever-like support structure.

If the upper surface 4A of the base member 4 which is connected to the first bonding film 30 at the location P1 is a metal surface, the molten metal (metal bonding member) 34 may also flow to the upper surface 4A of the base member 4. However, the flow of the molten metal stops at a boundary with an insulating region provided on the upper surface 4A of the base member 4, so that occurrence of failures such as a short-circuit can be prevented.

As described above, in the second embodiment, the distance X1 between the end portion (i.e., end surface) 30A of the first bonding film 30 at the reflecting surface 20A side and the lower end portion Q2 of the reflecting surface 20A is different from the distance X2 between the end portion (i.e., end surface) 32A of the second bonding film 32 at the reflecting surface 20A side and the lower end portion Q2 of the reflecting surface 20A, and therefore much of the molten metal (i.e., metal bonding member) 34 squeezed out from a gap between the first bonding film 30 and the second bonding film 32 during bonding of the base member 4 and the lateral wall portion 8 can be accommodated on the upper surface 30B of the first bonding film 30. Thus, a solder ball with an unstable cantilevered-like support structure is not formed, and the base member 4 and the lateral wall portion 8 can be firmly bonded to each other by a fillet structure.

Each of the end portions (i.e., end surfaces) 30A and 32A of the first bonding film 30 and the second bonding film 32 at the reflecting surface side is located separately from the lower end portion Q2 of the reflecting surface 20A, so that the molten metal (i.e., metal bonding member) 34 does not creep onto the reflecting surface 20A, and reduction in the reflectance of the reflecting surface 20A can be prevented.

As described above, in the second embodiment, the light source device 2 with a structure having a high reliability can be provided in which the reflecting surface 20A of high reflectance inclined with respect to the upper surface 4A of the base member 4 on which the semiconductor laser 6 is mounted. In plan view where the light source device is seen from above, the distance X1 between the end portion (i.e., end surface) 30A of the first bonding film 30 at the reflecting surface 20A side and the lower end portion Q2 of the reflecting surface 20A may not be necessarily different from the distance X2 between the end portion (i.e., end surface) 32A of the second bonding film 32 at the reflecting surface 20A side and the lower end portion Q2 of the reflecting surface 20A in the whole region. As long as an area sufficient for accommodating the molten metal (i.e., metal bonding member) 34 squeezed out from a gap between the first boding film 30 and the second bonding film 30 can be secured on the upper surface 30B of the first bonding film 32, the distance X1 may be the same as the distance X2 in a part of the region.

Difference Between Distance X1 and Distance X2

In the second embodiment, it is preferable that a difference between the distance X1 between the end portion (i.e., end surface) 30A of the first bonding film 30 at the reflecting surface 20A side and the lower end portion Q2 of the reflecting surface 20A and the distance X2 between the end portion (i.e., end surface) 32A of the second bonding film 32 at the reflecting surface 20A side and the lower end portion Q2 of the reflecting surface 20A, i.e. a length of the upper surface 30B of the first bonding film 30 which accommodates much of the molten metal (i.e., metal bonding member) 34 that is squeezed out, is selected according to the amount of the molten metal (i.e., metal bonding member) 34 to be charged between the first bonding film 30 and the second bonding film 32 during bonding.

With a length of the upper surface 30B of the first bonding film 30, on which much of the molten metal (metal bonding member) 34 squeezed out from a gap between the first bonding film 30 and the second bonding film 32 is accommodated, selected according to the amount of the molten metal (metal bonding member) 34, it is possible to reliably form a fillet structure in which a solder ball is not generated.

In the second embodiment, the difference between the distance X1 between the end portion (i.e., end surface) 30A of the first bonding film 30 at the reflecting surface 20A side and the lower end portion Q2 of the reflecting surface 20A and the distance X2 between the end portion (i.e., end surface) 32A of the second bonding film 32 at the reflecting surface 20A side and the lower end portion Q2 of the reflecting surface 20A (i.e., X2−X1) is preferably approximately in a range of 5 to 20%, more preferably approximately 10 to 15%, of the length L of the lower surface 8C of the lateral wall portion 8 (see FIG. 4).

Further, in the second embodiment, the distance X2 between the end portion (i.e., end surface) 32A of the second bonding film 32 at the reflecting surface 20A side and the lower end portion Q2 of the reflecting surface 20A is longer than the distance X1 between the end portion (i.e., end surface) 30A of the first bonding film 30 at the reflecting surface 20A side and the lower end portion Q2 of the reflecting surface 20A. That is, the first bonding film 30 disposed at the lower side is formed to extend farther toward the reflecting surface 20A side than the second bonding film 32 disposed on the upper side extends. Thus, the bonding region can be increased, and the allowable range for variations in bonding position between the base member 4 and the lateral wall portion 8 can be expanded. Further, the distance X2 between the end portion (i.e., end surface) 32A of the second bonding film 32 at the reflecting surface 20A side and the lower end portion Q2 of the reflecting surface 20A can be increased, and therefore the molten metal can be more securely prevented from creeping toward the reflecting surface 20A side.

Method of Manufacturing Light Source Device According to First and Second Embodiments One example of a method of manufacturing the light source device according to the first and second embodiments will be described with reference to FIGS. 8A to 8E. FIGS. 8A to 8E are schematic views showing operations in one example of the method of manufacturing the light source device according to the first and second embodiments. In FIGS. 8A to 8E, an example of the light source device has the bonding structure of the lateral wall portion according to the second embodiment as shown in FIG. 4 is illustrated, and the bonding structure of the lateral wall portion of the light source device has according to the first embodiment as shown in FIG. 3 is similar to that in FIGS. 8A to 8E.

Figure 8A:
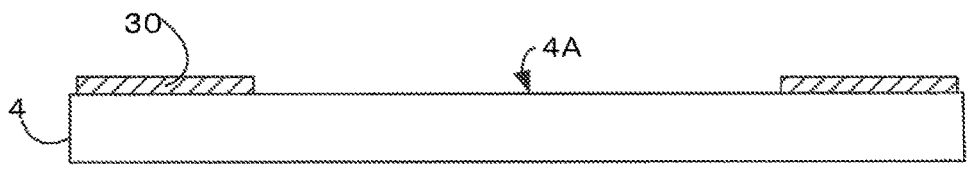
FIG. 8A is a schematic view showing an operation in an example of a method of manufacturing a light source device according to first and second embodiments of the present disclosure.

The base member 4, on which a wiring layer electrically connected to a positive electrode and a negative electrode of a semiconductor laser is disposed, is provided as shown in FIG. 8A. The wiring layer is formed by patterning or the like on the base member 4 made of aluminum nitride. A mask is applied to a region other than a region of the upper surface 4A of the base member 4 where a lateral wall portion 8 is attached, and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, the first bonding film 30 including a layered structure including the first layer and the second layer, and the third layer, which is a bonding layer, can be formed.

Alternatively, by sputtering or vapor deposition, only the third layer composed of a film containing gold (Au) may be formed on the first layer without forming the second layer. The method of forming the first bonding film 30 is not limited to sputtering or vapor deposition, and a method such as plating or printing can be alternatively used.

Figure 8B:
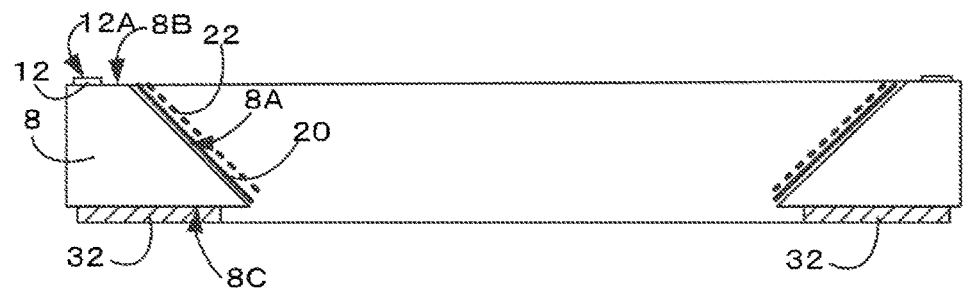
FIG. 8B is a schematic view showing an operation in an example of a method of manufacturing a light source device according to the first and second embodiments of the present disclosure.

Next, as shown in FIG. 8B, the lateral wall portion 8 having an inclined inside surface 8A is provided by anisotropic etching of silicon. The inclined surface may also be formed by a method other than anisotropic etching. A mask is applied to a region except for the inner surface 8A of the lateral wall portion 8, and by sputtering or vapor deposition, a first layer composed of a film containing titanium (Ti) or the like is formed, a second layer composed of a film containing platinum (Pt) is stacked on the first layer, and a third layer composed of a film containing silver (Ag) is stacked on the second layer. Accordingly, the reflecting film 20 including a layered structure including the first layer and the second layer, and the third layer, which is a reflecting layer, can be formed.

Alternatively, by sputtering or vapor deposition, only the third layer composed of a film containing silver (Ag) may be formed on the first layer without forming the second layer.

Further, a mask is applied to a region except for the inner surface 8A of the lateral wall portion 8, and a dielectric film is formed by sputtering or vapor deposition. Accordingly, a dielectric film 22 for improving the reflectivity can be formed on the reflecting film 20 formed on the inner surface A of the lateral wall portion 8.

Further, a mask is applied to a region except for the lower surface 8C of the lateral wall portion 8, and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, the second bonding film 32 including a layered structure including the first layer and the second layer, and the third layer, which is a bonding layer, can be formed on the lower surface of the lateral wall portion 8.

Alternatively, by sputtering or vapor deposition, only the third layer composed of a film containing gold (Au) may be formed on the first layer without forming the second layer.

Further, a mask is applied to a region except for a region of the upper surface 8B of the lateral wall portion 8 where a connection member is attached, and by sputtering or vapor deposition, the connection member 12 composed of aluminum or an aluminum alloy is formed. Accordingly, the connection member 12 can be formed on the upper surface 8B of the lateral wall portion 8.

Alternatively, as in the process of manufacturing the bonding films 30 and 32, the first layer may be formed on the upper surface 8B of the lateral wall portion 8, followed by forming the connection member 12 on the first layer.

A method of manufacturing a single light source device is shown in FIGS. 8A to 8E, but a plurality of base members 4 and lateral wall portions 8 connected to each other may be manufactured and divided at appropriate locations, which allows for efficiently providing a plurality of light source devices. In this case, as shown in FIG. 8A, the upper surface 4A of the base member 4 includes a region on which the first bonding film 30 is not formed with a predetermined area between a periphery of the upper surface 4A and the first bonding film 30. Similarly, as shown in FIG. 8B, the lower surface 8C of the lateral wall portion 8 includes a region on which the second bonding film 32 is not formed with a predetermined area between a periphery of the lower surface 8C and the second bonding film 32, and the upper surface 8B of the lateral wall portion 8 includes a region on which the connection member 12 is not formed with a predetermined area between a periphery of the upper surface 8B and the connection member 12. These regions are provided so that the first bonding film 30, the second bonding film 32, the connection member 12 and the like, which are metal patterns, are prevented from being damaged by dicing etc. in a subsequent dividing step.

Figure 8C:
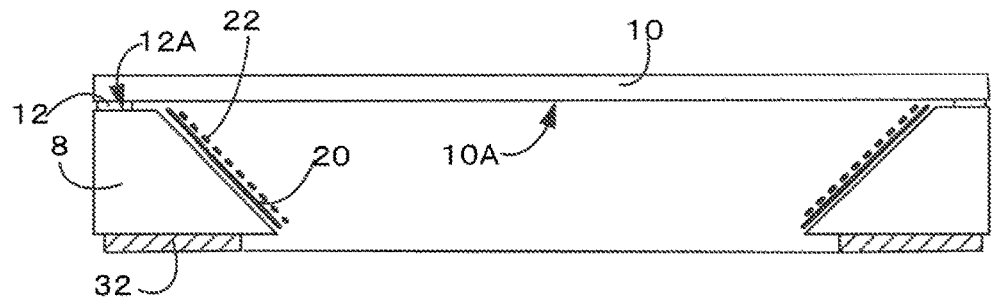
FIG. 8C is a schematic view showing an operation in an example of a method of manufacturing a light source device according to the first and second embodiments of the present disclosure.

Next, as shown in FIG. 8C, the cover 10 made of glass is provided, heating is performed while an upper surface 12A of the connection member 12 formed on the lateral wall portion 8 and a lower surface 10A of the cover 10 are in contact with each other, and a predetermined voltage is applied between the upper surface 12A and the lower surface 10A in a state where the connection member 12 serves as an anode to perform anodic bonding. Accordingly, a bonding structure between the connection member 12 and the cover 10 with high airtightness can be obtained.

Figure 8D:
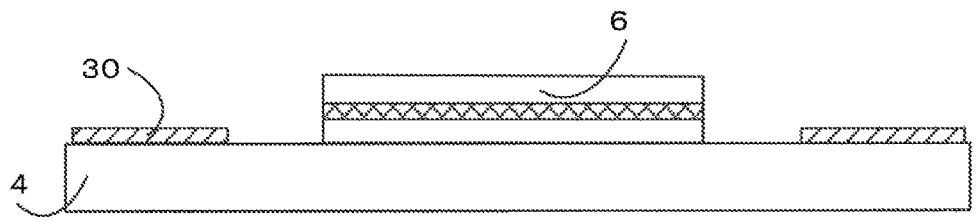
FIG. 8D is a schematic view showing an operation in an example of a method of manufacturing a light source device according to the first and second embodiments of the present disclosure.

Next, as shown in FIG. 8D, a semiconductor laser 6 is mounted on the base member 4 in this package. In one example of a mounting method, an n-electrode at a bottom surface side of the semiconductor laser 6 and a wiring layer disposed on the base member 4 are bonded via a bonding member such as a bump, and a p-electrode at an upper surface side of the semiconductor laser 6 and the wiring layer disposed on the base member 4 are wire-bonded to each other. In another example, the semiconductor laser 6 having an n-electrode and a p-electrode at the same surface side, where both the n-electrode and the p-electrode are bonded to the wiring layer via a bonding member.

The semiconductor laser 6 can also be mounted on the base member 4 via a sub-mount. For the sub-mount, a material having high electric insulation property and high thermal conductivity is typically used. Examples of the submount include aluminum nitride and silicon carbide.

Figure 8E:
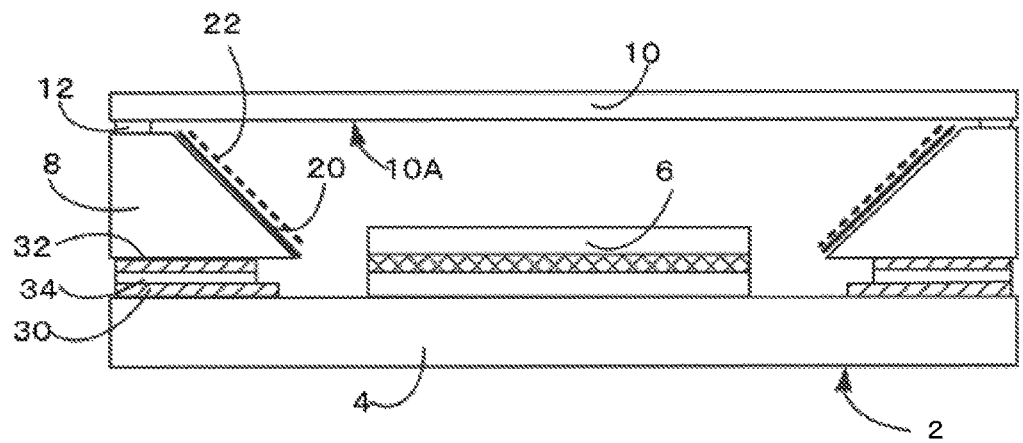
FIG. 8E is a schematic view showing an operation in an example of a method of manufacturing a light source device according to the first and second embodiments of the present disclosure.

Next, as shown in FIG. 8E, the bonding surface of the bonding film 30 formed on the base member 4 and the bonding surface of the bonding film 32 formed on the lower surface of the lateral wall portion 8 are bonded to each other by a metal-fusion bonding sing, for example, a metal bonding member 34 made of tin (Sn), silver (Ag), copper (Cu), gold (Au) or nickel (Ni). Accordingly, a bonding structure between the base member 4 and the lateral wall portion 8 with high airtightness is obtained using the metal bonding member 34. The metal bonding member 34 that has been provided is desired to have a size the same as that of the bonding film 30. In this manner, even when the metal bonding member 34 protrudes during bonding, the metal bonding member 34 can be stopped at an end portion 32B of the bonding film 32.

The bonding can be performed not only by a bonding process using the metal bonding member 34 but also by for example, heating and pressurizing the bonding surface of the bonding film 30 and the bonding surface of the bonding film 32 to perform diffusion bonding.

Through the above-described manufacturing method, a light source device 2 with the semiconductor laser 6 airtightly enclosed in a package as shown in FIG. 1 can be manufactured.

The operation shown in FIG. 8D can be carried out at any time separately from the operations in FIGS. 8B and 8C as long as the operation in FIG. 8D is carried out between the operation shown in FIG. 8A and the operation shown in FIG. 8E. Further, the order of the operations in the above-mentioned manufacturing method can be appropriately changed. It is preferable to set the order of the operations such that a material with a higher melting point is applied in earlier operation in order to prevent a material in a later operation is not melted in a subsequent operation.

In the above-described embodiments, the base member 4 and the lateral wall portion 8 are formed of different members, but alternatively, a package member in which a base member and a lateral wall portion are integrally formed can also be used.

In the above-described embodiments, the connection member 12 and the cover 10 are bonded by anodic bonding, but alternatively, other bonding means such as welding, soldering and adhesion can also be used. In this case, examples of a material of the connection member 12 include a metal material other than aluminum or titanium, a resin material, and a ceramic material.

A photodiode or a Zener diode may be housed in a recess in which the semiconductor laser 6 is housed.

Light Source Device According to Third and Fourth Embodiments

Figure 9:
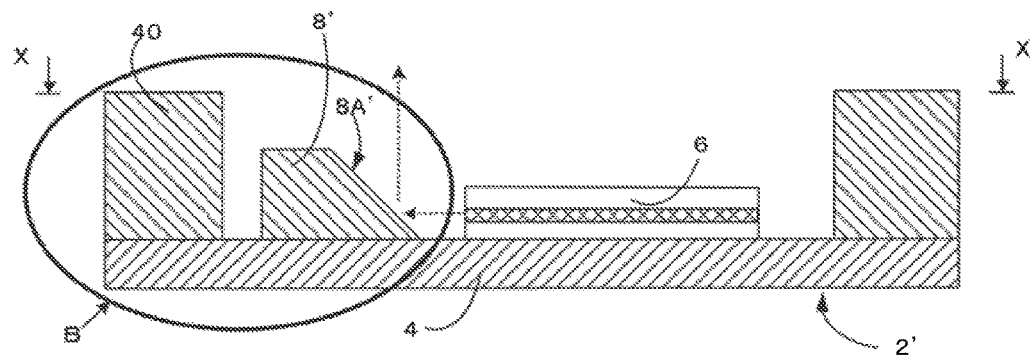
FIG. 9 is a schematic side sectional view showing a general structure of a light source device according to third and fourth embodiments of the present disclosure.
Figure 10:
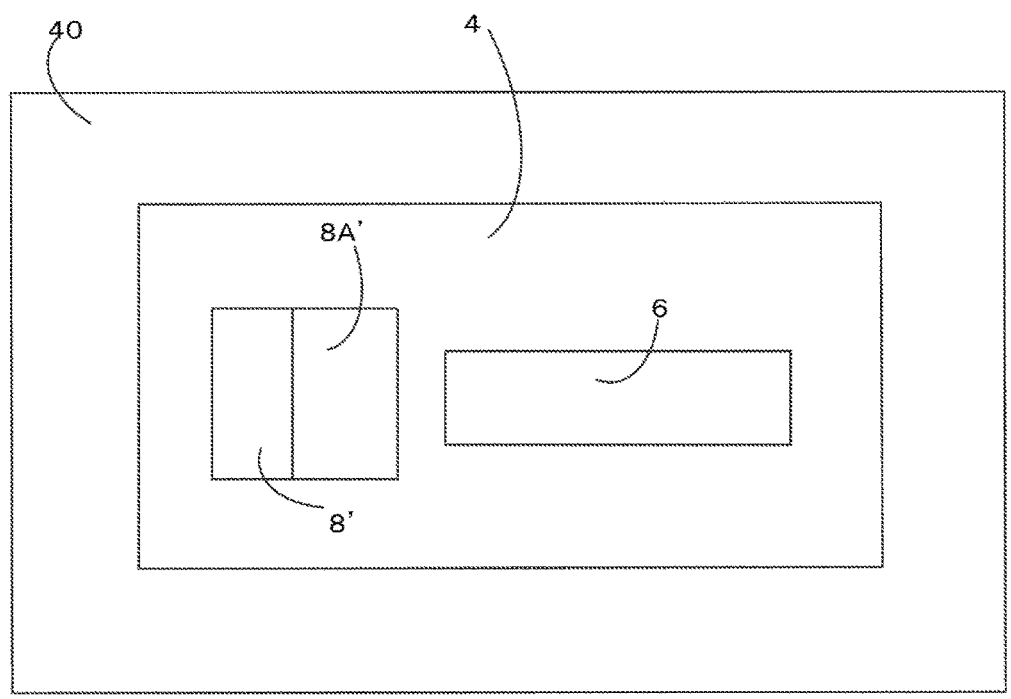
FIG. 10 is a view (plan view) viewed in a direction indicated by arrows X-X in FIG. 9.

A general structure of a light source device according to third and fourth embodiments of the present disclosure will be described with reference to FIGS. 9 and 10. FIG. 9 is a schematic side cross-sectional view showing a general structure of the light source device according to the third and fourth embodiments of the present disclosure. FIG. 10 is a view (plan view) in a direction indicated by arrows X-X in FIG. 9.

A light source device 2' according to the third and fourth embodiments is different from the light source device 2 according to the above-described embodiments in that a lateral wall portion 8' is not formed to surround a semiconductor laser 6, and is provided only at one surface side of the semiconductor laser 6 facing an emission surface of the semiconductor laser 6, in the plan view shown in FIG. 10. That is, the lateral wall portion 8' is formed as a raised mirror separate from constituent members of a package.

In the light source device 2' according to the third and fourth embodiments, a package member 40 is formed to surround the semiconductor laser 6, and a base member 4 and the package member 40 form a gap surrounding the semiconductor laser 6 and the lateral wall portion 8'. In FIG. 9, a cover covering the gap is not shown, but as in the above-described embodiment, a cover airtightly covering the gap can be provided, or an optical member such as a rod integral can be attached on the upper side of the package member 40.

In consideration of a case where suction of an upper surface of the lateral wall portion 8' is performed using a collet during mounting on the base member 4, it is preferable that the upper surface of the lateral wall portion 8' has a certain size. On the other hand, it is preferable that the upper surface of the lateral wall portion 8' has a small size in view of downsizing the light source device 2' in plan view. Thus, it is preferable to select an optimum shape of the lateral wall portion 8' with consideration given to a balance between these contradictory matters.

In addition, it is preferable that the package member 40 has lateral surfaces perpendicular to an upper surface of the base member 4 in view of downsizing the light source device 2' in plan view.

In the third and fourth embodiments, a ceramic material such as aluminum nitride, alumina, alumina-zirconia or silicon nitride is used as a material of the base member 4. Alternatively, a resin material, a single crystal of silicon or the like, a metal material provided with an insulating layer, or the like can also be used.

In the third and fourth embodiments, glass is used as a material of the lateral wall portion 8'. In this case, a reflecting surface 20A' inclined at 45° with respect to an upper surface 4A of the base member 4 can also be obtained. This allows for reflecting light emitted from the semiconductor laser 6' in a direction substantially orthogonal direction. The material of the lateral wall portion 8' is not limited to glass, and silicon as described above, a resin material, other ceramic material or the like can alternatively be used.

In the third and fourth embodiments, a ceramic material such as aluminum nitride, alumina, alumina-zirconia or silicon nitride is used as a material of the package member 40. Alternatively, a single crystal of silicon or the like, a resin material or the like can also be used. It is also preferable to use similar materials for the package member 40 and the base member 4 so that the package material 40 and the base member 4 have the same thermal expansion coefficient. Alternatively, the package member 40 and the base member 4 can be formed integrally with each other using a ceramic material, etc.

Bonding Structure of Lateral Wall Portion According to Third Embodiment

Figure 11:
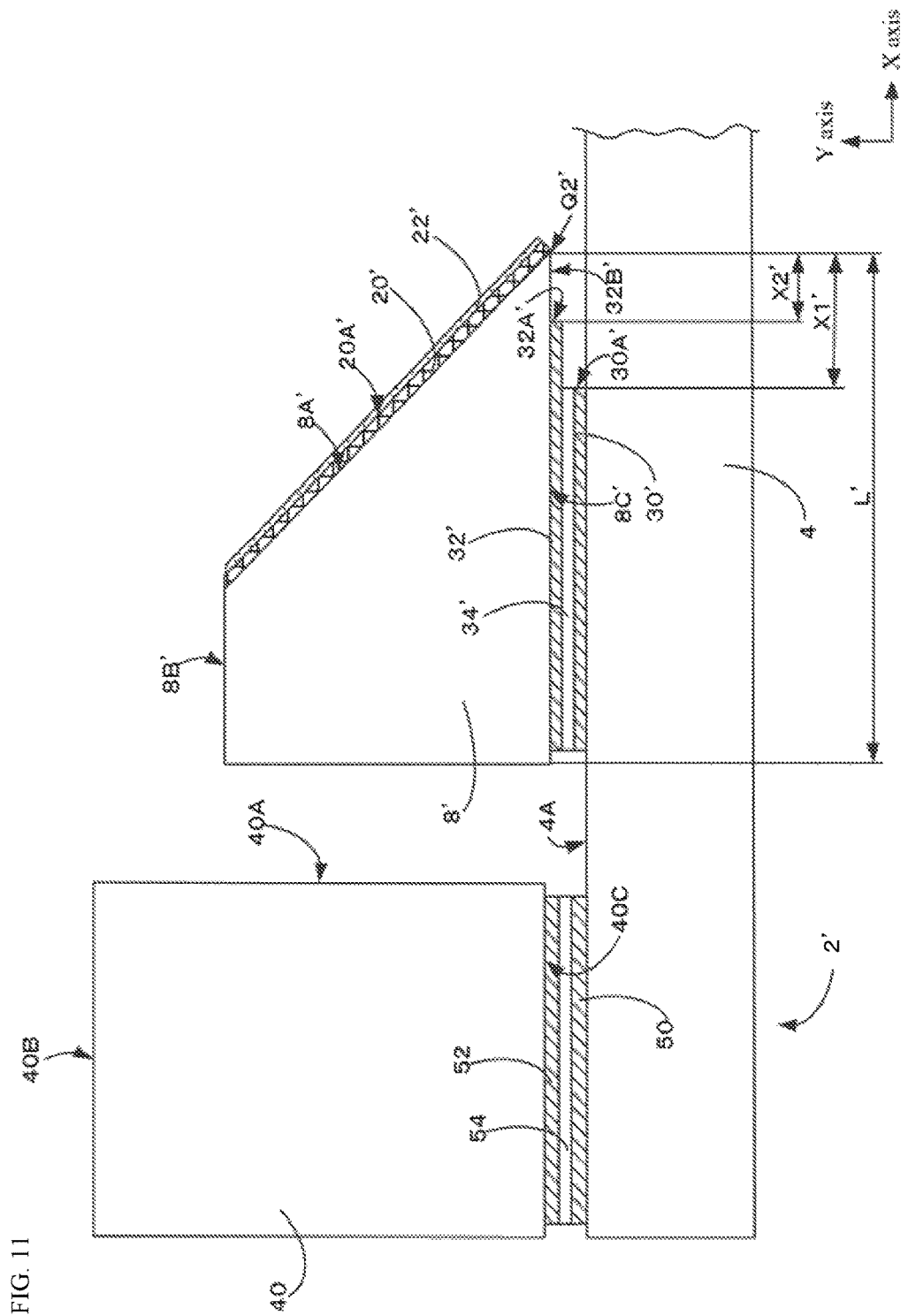
FIG. 11 is an enlarged side cross-sectional view showing a region indicated by B in FIG. 9, and shows a bonding structure of a lateral wall portion in a light source device according to the third embodiment of the present disclosure.

A bonding structure of the lateral wall portion in the light source device according to the third embodiment will be described with reference to FIG. 11. FIG. 11 is an enlarged side cross-sectional view showing a region indicated by B in FIG. 9, and shows the bonding structure of the lateral wall portion in the light source device according to the third embodiment.

In a bonding structure of the base member 4 and the lateral wall portion 8', which is the same as the above-described bonding structure shown in FIG. 3, a first bonding film 30' disposed on the upper surface 4A of the base member 4 and a second bonding film 32' disposed on a lower surface 8C' of the lateral wall portion 8' are bonded to each other via a metal bonding member 34'. Details of the first bonding film 30', the second bonding film 32' and the metal bonding member 34' are the same as in the case of the light source device according to the above-described first and second embodiments, and therefore further descriptions thereof are omitted.

On an inclined inner surface 8A' of the lateral wall portion 8', a reflecting film 20' and a dielectric film 22' are disposed, and the reflecting film 20' has a reflecting surface 20A having a high reflectance. Details of the reflecting film 20' and the dielectric film 22' are the same as in the light source device according to the first and second embodiments as described above, and therefore further descriptions thereof are omitted.

In a bonding structure of the base member 4 and the package member 40, a bonding film 50 disposed on the upper surface 4A of the base member 4 and a bonding film 52 disposed on a lower surface 40C of the package member 40 are bonded to each other by a metal bonding member 54. Details of the bonding film 50, the bonding film 52 and the metal bonding member 54 are the same as in the first bonding film 30', the second bonding film 32' and the metal bonding member 34' in the above-described bonding structure of the base member 4 and the lateral wall portion 8', therefore further descriptions thereof are omitted.

The bonding structure of the lateral wall portion in the light source device according to the third embodiment exhibits an effect similar to that of the bonding structure of the lateral wall portion in the light source device according to the first embodiment.

That is, with a difference between a distance X1' between an end portion (i.e., end surface) 30A' of the first bonding film 30' at the reflecting surface 20A' side and a lower end portion Q2' of the reflecting surface 20A' and a distance X2' between an end portion (i.e., end surface) 32A' of the second bonding film 32' at the reflecting surface 20A' side and the lower end portion Q2' of the reflecting surface 20A', much of the molten metal (metal bonding member) 34' squeezed out from a gap between the first bonding film 30' and the second bonding film 32' during bonding of the base member 4 and the lateral wall portion 8' can be accommodated on a lower surface 32B' of the second bonding film 32', so that a solder ball having an unstable cantilever-like support structure is not formed, and the base member 4 and the lateral wall portion 8' can be firmly bonded to each other with a fillet structure.

Further, the reflecting surface-side end portions (end surfaces) 30A' and 32A' of the first bonding film 30' and the second bonding film 32' are each disposed separately from the lower end portion Q2' of the reflecting surface 20A', which can prevent the molten metal (metal bonding member) 34' from creeping onto the reflecting surface 20A' side, so that reduction in the reflectance of the reflecting surface 20A' can be prevented.

Thus, in the light source device according to the third embodiment, the light source device 2' with a highly reliable structure can be provided in which the reflecting surface 20A' with a high reflectance inclined with respect to the upper surface 4A of the base member 4, on which the semiconductor laser 6' is mounted, is provided.

By selecting a length of the lower surface 32B' of the second bonding film 32', on which much of the molten metal (metal bonding member) 34' squeezed out from a gap between the first bonding film 30' and the second bonding film 32' is accommodated, in accordance with the amount of the molten metal (metal bonding member) 34' to be charged (particularly, in accordance with a length L' of the lower surface 8C' of the lateral wall portion 8' as shown in FIG. 11), it is possible to form a fillet structure in which a solder ball is not generated.

Bonding Structure of Lateral Wall Portion According to Fourth Embodiment

Figure 12:
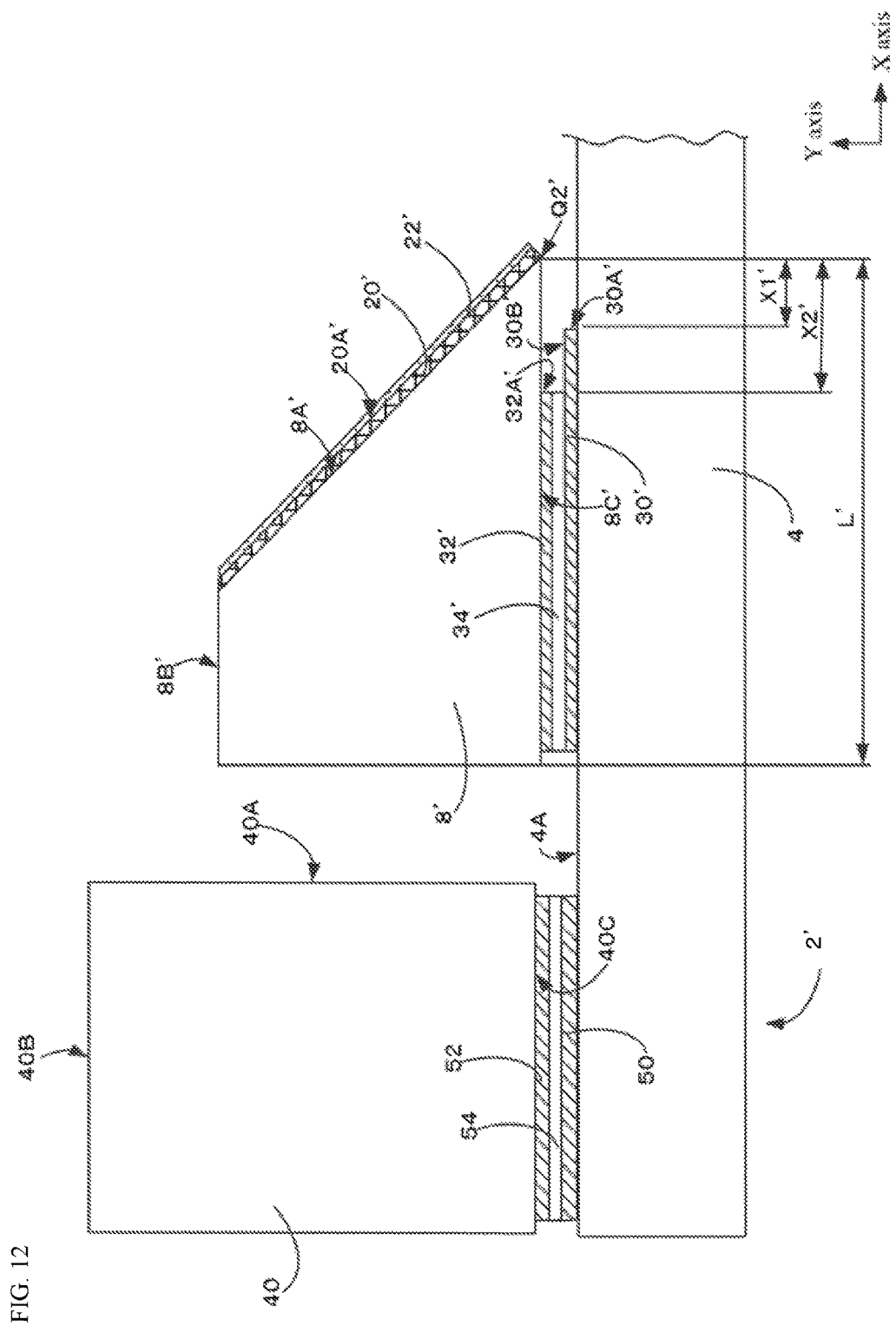
FIG. 12 is an enlarged side cross-sectional view showing a region indicated by B in FIG. 9, and shows a bonding structure of a lateral wall portion in a light source device according to the fourth embodiment of the present disclosure.

A bonding structure of the lateral wall portion in the light source device according to the fourth embodiment will be described with reference to FIG. 12. FIG. 12 is an enlarged side cross-sectional view showing a region indicated by B in FIG. 9, and shows the bonding structure of the lateral wall portion in the light source device according to the fourth embodiment.

The bonding structure of the lateral wall portion in the light source device according to the fourth embodiment exhibits an effect similar to that of the bonding structure of the lateral wall portion in the light source device according to the second embodiment as described above.

That is, the distance X1' between the end portion (i.e., end surface) 30A' of the first bonding film 30' at the reflecting surface 20A' side and the lower end portion Q2' of the reflecting surface 20A' is different from the distance X2' between the end portion (i.e., end surface) 32A' of the second bonding film 32' at the reflecting surface 20A' side and the lower end portion Q2' of the reflecting surface 20A', much of the molten metal (metal bonding member) 34' squeezed out from a gap between the first bonding film 30' and the second bonding film 32' during bonding of a base member 4' and the lateral wall portion 8' can be accommodated on an upper surface 30B' of the first bonding film 30'. Thus, an unstable solder ball is hardly formed, and the base member 4' and the lateral wall portion 8' can be firmly bonded to each other by a fillet structure.

In addition, the end portions (i.e., end surfaces) 30A' and 32A' of the first bonding film 30' at the reflecting surface 20A' side and the second bonding film 32' are each disposed separately from the lower end portion Q2' of the reflecting surface 20A', which allows the molten metal (i.e., metal bonding member) 34' to be prevented from creeping onto the reflecting surface 20A' side, so that reduction in the reflectance of the reflecting surface 20A' can be prevented.

Thus, in the light source device according to the fourth embodiment, the light source device 2' with a highly reliable structure is provided in which the reflecting surface 20A', which reflects light emitted from the semiconductor laser 6 is inclined with respect to the base member 4, of a high reflectance is provided.

By selecting a length of the upper surface 30B' of the first bonding film 30' on which much of the molten metal (metal bonding member) 34' squeezed out from a gap between the first bonding film 30' and the second bonding film 32' is accommodated, in accordance with the amount of the molten metal (metal bonding member) 34' to be charged (particularly, in accordance with the length L' of the lower surface 8C' of the lateral wall portion 8' (see FIG. 12)), it is possible to form a fillet structure in which a solder ball is not generated.

In particular, in the fourth embodiment, the first bonding film 30' disposed at the lower side is formed to extend farther to the reflecting surface 20A' side than the second bonding film 32' disposed at the upper side extends. Therefore, the bonding region can be increased, and the allowable range for variations in position of bonding between the base member 4' and the lateral wall portion 8' can be expanded. Further, the distance X2' between the end portion (i.e., end surface) 32A' of the second bonding film 32' at the reflecting surface 20A' side and the lower end portion Q2' of the reflecting surface 20A' can be increased, and therefore the molten metal can be more greatly prevented from going around to the reflecting surface 20A' side.

Method of Manufacturing Light Source Device According to Third and Fourth Embodiments One example of method of manufacturing the light source device according to third and fourth embodiments will be described with reference to FIGS. 13A to 13D. FIGS. 13A to 13D are schematic views showing operations in an example of a method of manufacturing the light source device according to third and fourth embodiments. FIGS. 13A to 13D illustrate an example in which the light source device has the bonding structure of the lateral wall portion according to the fourth embodiment as shown in FIG. 12, and the same applies to a case where the light source device has the bonding structure of the lateral wall portion according to the fourth embodiment as shown in FIG. 11.

Figure 13A:
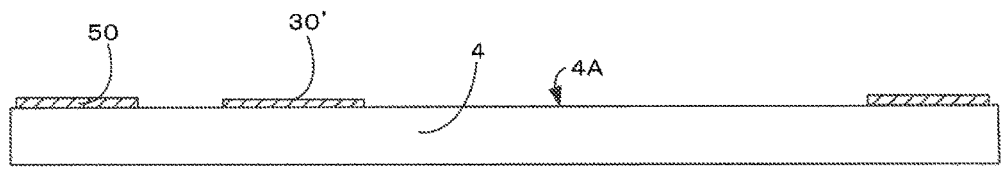
FIG. 13A is a schematic view showing an operation in an example of a method of manufacturing a light source device according to the third and fourth embodiments of the present disclosure.

As shown in FIG. 13A, a wiring layer is patterned on a base member made of a ceramic material such as nitride aluminum to provide the base member 4 on which the wiring layer to be electrically connected to a positive electrode and a negative electrode of a semiconductor laser is disposed. Alternatively, the base member 4 on which a wiring layer is formed may be purchased and used. A mask is applied to a region of the upper surface 4A of the base member 4 except for a region where a lateral wall portion 8' is to be attached and a region where a package member 40 is to be attached, and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, the first bonding film 30' and the bonding film 50 each including a layered structure including the first layer, the second layer, and the third layer can be formed.

Alternatively, by sputtering or vapor deposition, only the third layer composed of a film containing gold (Au) may be formed on the first layer without forming the second layer.

Figure 13B:
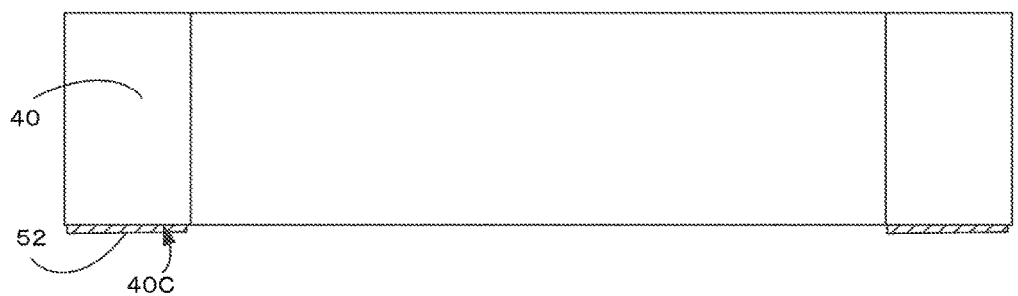
FIG. 13B is a schematic view showing an operation in an example of a method of manufacturing a light source device according to the third and fourth embodiments of the present disclosure.

Next, as shown in FIG. 13B, the package member 40 opened at the center thereof and made of a ceramic material such as nitride aluminum is provided. The package member 40 having a predetermined shape may be purchased and used. A mask is applied to a region except for the lower surface 40C of the package member 40, and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, the bonding film 52 including a layer including the first layer and the second layer, and the third layer, which is a bonding layer, can be formed on the lower surface 40C of the package member 40.

Alternatively, by sputtering or vapor deposition, only the third layer composed of a film containing gold (Au) may be formed on the first layer without forming the second layer.

Figure 13C:
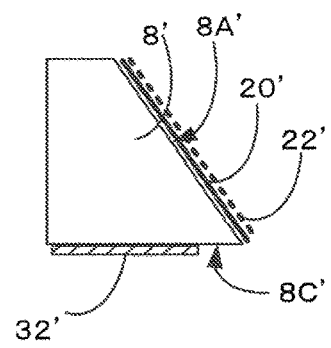
FIG. 13C is a schematic view showing an operation in an example of a method of manufacturing a light source device according to the third and fourth embodiments of the present disclosure.

Next, as shown in FIG. 13C, the lateral wall portion 8', which has the inclined inner surface 8A' and is made of glass, is provided. A lateral wall portion provided with an inclined inner surface may be purchased and used. A mask is applied to a region except for the inner surface 8A' of the lateral wall portion 8', and by sputtering or vapor deposition, a first layer composed of a film containing titanium (Ti) or the like is formed, a second layer composed of a film containing platinum (Pt) is stacked on the first layer, and a third layer composed of a film containing silver (Ag) is stacked on the second layer. Accordingly, the reflecting film 20' including a layered structure including the first layer and the second layer, and the third layer, which is a reflecting layer, can be formed.

Alternatively, by sputtering or vapor deposition, only the third layer composed of a film containing silver (Ag) may be formed on the first layer without forming the second layer.

Further, a mask is applied to a region except for the inside surface 8A' of the lateral wall portion 8', and a dielectric film is formed by sputtering or vapor deposition. Accordingly, a dielectric film 22' for improving the reflectance can be formed on the reflecting film 20' disposed on the inner surface 8A' of the lateral wall portion 8'.

Next, as shown in FIG. 13C, a mask is applied to a region except for the lower surface 8C' of the lateral wall portion 8', and by sputtering or vapor deposition, a first layer composed of a film containing titanium (Ti) or the like is formed, a second layer composed of a film containing platinum (Pt) is stacked on the first layer, and a third layer composed of a film containing gold (Au) is stacked on the second layer. Accordingly, the second bonding film 32' including a layered structure including the first layer and the second layer, and the third layer that is a bonding layer can be formed on the lower surface 8C' of the lateral wall portion 8'.

Alternatively, by sputtering or vapor deposition, only the third layer composed of a film containing gold (Au) may be formed on the first layer without forming the second layer.

A method of manufacturing a single light source device is shown in FIGS. 13A to 13D, but a plurality of base members 4 and package members 40 connected to each other may be manufactured and divided at appropriate locations. Similarly, a plurality of lateral wall portions 8' connected to each other may be manufactured, and then divided into individual lateral wall portions 8'. Accordingly, a plurality of light source devices and lateral wall portions 8' can be efficiently manufactured. In this case, as shown in FIG. 13A, a region where the bonding film 50 is not formed with a predetermined area is provided between the periphery of the upper surface 4A of the base member 4 and the bonding film 50. Similarly, as shown in FIG. 13B, a region where the bonding film 52 is not formed with a predetermined area is provided between the periphery of the lower surface 40C of the package member 40 and the bonding film 52. As shown in FIG. 13C, a region where the second bonding film 32' is not formed with a predetermined area is provided between the periphery of the lower surface 8C' of the lateral wall portion 8'. These regions are provided so that the bonding film 50, the bonding film 52, the second bonding film 32' and the like, which are metal patterns, are prevented from being damaged by dicing etc., in a subsequent dividing step.

Figure 13D:
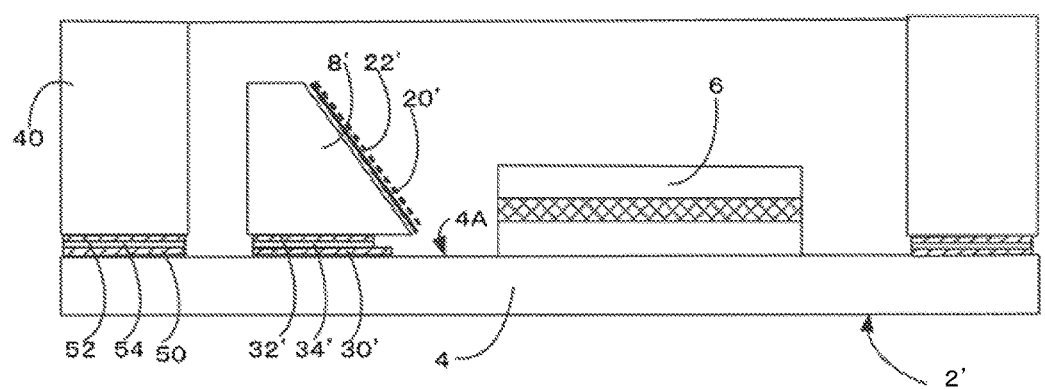
FIG. 13D is a schematic view showing one operation in one example of a method of manufacturing a light source device according to the third and fourth embodiments of the present disclosure.

Next, as shown in FIG. 13D, the bonding film 30' formed on the upper surface 4A of the base member 4 and the bonding film 32' formed on the lower surface 8C' of the lateral wall portion 8' are bonded to each other, and the bonding film 50 formed on the upper surface 4A of the base member 4 and the bonding film 52 formed on the lower surface 40C of the package member 40 are bonded to each other, by a metal-fusion bonding using, for example, a metal bonding member composed of tin (Sn), silver (Ag), copper (Cu), gold (Au) or nickel (Ni). Accordingly, a firm bonding structure between the base member 4 and the lateral wall portion 8' and a firm bonding structure between the base member 4 and the package member 40 that use a metal bonding member are obtained. The semiconductor laser 6 is mounted on the upper surface 4A of the base member 4. The method of mounting the semiconductor laser 6 is the same as in the above-described method of manufacturing a single light source device 2, and therefore further descriptions thereof are omitted.

The step of attaching the lateral wall portion 8' and the package member 40 to the upper surface 4A of the base member 4, and mounting the semiconductor laser 6 can be carried out at one time. Alternatively, the lateral wall portion 8' and the package member 40 can be attached to the base member 4, followed by mounting the semiconductor laser 6. It is preferable to perform attaching and mounting, such as attachment of a cover and an optical member to be attached on the upper side, in an optimum procedure.

Through the manufacturing process as described above, the light source device 2' including the semiconductor laser 6 and the lateral wall portion 8' that functions as a raised mirror as shown in FIG. 9 can be manufactured.

The order of the steps in the above-described manufacturing process can be appropriately changed. In this case, it is preferable to set the order of the steps so that a member made of a material with a higher melting point is attached earlier, in order to prevent a material of a member applied in an earlier step from being melted in a later step.

Certain embodiments and implementations of the present invention have been described above, and details of the configuration therein may be changed, and change or the like in the combination and order of elements in embodiments can be made without departing from the scope and spirit of the present invention.

DENOTATION OF REFERENCE NUMERALS 2, 2' Light source device
4 Base member
6 Semiconductor laser
8, 8' Lateral wall portion
8A, 8A' Inside surface
8B, 8B' Upper surface
10 Cover
10A Lower surface
10B Upper surface
12 Connection member
12A Upper surface
20, 20' Reflecting film
20A, 20A' Reflecting surface
22, 22' Dielectric film
30, 30' Bonding film
30A, 30A' End portion (end surface)
30B, 30B' Upper surface
32, 32' Bonding film
32A, 32A End portion (end surface)
32B, 32B' Lower surface
34, 34' Metal bonding member
Q2, Q2' Lower end portion of reflecting surface

What is claimed is:

1. A light source device comprising:
a base member;
a semiconductor laser mounted on an upper surface of the base member;
a lateral wall portion having:
a lower surface facing the upper surface of the base member and being a non-reflecting surface, and
a reflecting surface that reflects light emitted from the semiconductor laser, is connected to the lower surface of the lateral wall portion at a lower end portion of the reflecting surface, and is inclined with respect to the upper surface of the base member;
a first bonding film that is a metal film disposed in a region on the upper surface of the base member facing the lower surface of the lateral wall portion;
a second bonding film that is a metal film disposed on the lower surface of the lateral wall portion; and
a metal bonding member fuse-bonded to the first bonding film and the second bonding film to each other, wherein
an end portion of the first bonding film at a reflecting-surface side is not in line with the lower end portion of the reflecting surface,
an end portion of the second bonding film at the reflecting-surface side is not in line with the lower end portion of the reflecting surface, and
a distance between the end portion of the first bonding film at the reflecting-surface side and the lower end portion of the reflecting surface is different from a distance between the end portion of the second bonding film at the reflecting-surface side and the lower end portion of the reflecting surface.

2. The light source device according to claim 1, wherein the lateral wall portion is disposed to surround the semiconductor laser, and the reflecting surface is disposed to surround the semiconductor laser.

3. The light source device according to claim 2, further comprising a light-transmissive cover airtightly covering a gap surrounded by the base member and the lateral wall portion.

4. The light source device according to claim 1, wherein each of the first and second bonding films includes a layer having a film containing platinum.

5. The light source device according to claim 1, wherein the metal bonding member is made of gold-tin or other solder material containing tin.

6. The light source device according to claim 1, wherein a film containing silver or aluminum, and a dielectric film are disposed on the reflecting surface.

7. A light source device comprising:
a base member;
a semiconductor laser mounted on an upper surface of the base member;
a lateral wall portion having:
a lower surface facing the upper surface of the base member and being a non-reflecting surface, and
a reflecting surface that reflects light emitted from the semiconductor laser, is connected to the lower surface of the lateral wall portion at a lower end portion of the reflecting surface, and is inclined with respect to the upper surface of the base member;
a first bonding film that is a metal film disposed in a region on the upper surface of the base member facing the lower surface of the lateral wall portion;
a second bonding film that is a metal film disposed on the lower surface of the lateral wall portion; and
a metal bonding member fuse-bonded to the first bonding film and the second bonding film to each other, wherein
an end portion of the first bonding film at a reflecting-surface side is not in line with the lower end portion of the reflecting surface,
an end portion of the second bonding film at the reflecting-surface side is not in line with the lower end portion of the reflecting surface, and
a distance between the end portion of the first bonding film at the reflecting-surface side and the lower end portion of the reflecting surface is different from a distance between the end portion of the second bonding film at the reflecting-surface side and the lower end portion of the reflecting surface,
wherein a difference between a distance between the end portion of the first bonding film at the reflecting-surface side and the lower end portion of the reflecting surface and a distance between the end portion of the second bonding film at the reflecting-surface side and the lower end portion of the reflecting surface is selected in accordance with an amount of the metal bonding member to be charged between the first bonding film and the second bonding film.

8. The light source device according to claim 7, wherein the distance between the end portion of the second bonding film at the reflecting-surface side and the lower end portion of the reflecting surface is longer than the distance between the end portion of the first bonding film at the reflecting-surface side and the lower end portion of the reflecting surface.

9. A light source device comprising:
a base member;
a semiconductor laser mounted on an upper surface of the base member;
a lateral wall portion having:
a lower surface facing the upper surface of the base member and being a non-reflecting surface, and
a reflecting surface that reflects light emitted from the semiconductor laser, is connected to the lower surface of the lateral wall portion at a lower end portion of the reflecting surface, and is inclined with respect to the upper surface of the base member;

a first bonding film that is a metal film disposed in a region on the upper surface of the base member facing the lower surface of the lateral wall portion;
a second bonding film that is a metal film disposed on the lower surface of the lateral wall portion; and
a metal bonding member fuse-bonded to the first bonding film and the second bonding film to each other, wherein
an end portion of the first bonding film at a reflecting-surface side is not in line with the lower end portion of the reflecting surface,
an end portion of the second bonding film at the reflecting-surface side is not in line with the lower end portion of the reflecting surface, and
a distance between the end portion of the first bonding film at the reflecting-surface side and the lower end portion of the reflecting surface is different from a distance between the end portion of the second bonding film at the reflecting-surface side and the lower end portion of the reflecting surface,
wherein the distance between the end portion of the second bonding film at the reflecting-surface side and the lower end portion of the reflecting surface is longer than the distance between the end portion of the first bonding film at the reflecting-surface side and the lower end portion of the reflecting surface.

* * * * *